United States Patent [19]
Chiou et al.

[11] Patent Number: 6,052,039
[45] Date of Patent: Apr. 18, 2000

[54] LUMPED CONSTANT COMPENSATED HIGH/LOW PASS BALANCED-TO-UNBALANCED TRANSITION

[75] Inventors: Hwann-Kaeo Chiou; Hao-Hsiung Lin, both of Taipei, Taiwan

[73] Assignee: National Science Council, Taipei, Taiwan

[21] Appl. No.: 08/896,979

[22] Filed: Jul. 18, 1997

[51] Int. Cl.$^7$ .............................. H03H 7/48; H03H 7/42
[52] U.S. Cl. ........................... 333/100; 333/25; 455/323
[58] Field of Search ..................................... 333/100, 118, 333/129, 132, 25, 32

[56] References Cited

U.S. PATENT DOCUMENTS

| | | | |
|---|---|---|---|
| 4,851,795 | 7/1989 | Beckwith | 333/118 X |
| 5,023,576 | 6/1991 | Staudinger et al. | 333/25 X |
| 5,339,462 | 8/1994 | Staudinger et al. | 333/118 X |

OTHER PUBLICATIONS

Marchand, Nathan, "Transmission–Line conversion," *Electronics*, pp. 142–145, Dec. 1944.
Hallford, Ben R., "A Designer's Guide To planar Mixer Baluns," *Microwaves*, pp. 52–57, Dec. 1979.
Cloete, J.H., "Graphs of Circuit Elements for the Marchand Balun," *Microwave Journal*, pp. 125–128, May 1981.
Li, et al. "Broadband Coplanar Waveguide–coplanar Strip–fed Spiral Antenna," *Electronics Letters*, vol. 31, No. 1, pp. 4–5, Jan. 1995.
Ho, Chen Y. "New analysis technique builds better baluns," *Microwaves & RF*, pp. 99–102, Aug. 1985.
Bawer R. and Wolfe, J.J. "a Printed Circuit Balun for Use with Spiral Antennas," *IRE Transactions on Microwave Theory and Techniques*, May 1960.
Oltman, George, "The Compensated Balun," *IEEE Transactions on Microwave Theory and Techniques*, vol. MTT–14, No. 3, pp. 112–119, Mar. 1966.
Laughlin, Gordon J., "A New Impedance–Matched Wide–Band Balun and Magic Tee," *IEEE Transactions on Microwave Theory and Techniques*, vol. MTT–24, No. 3, pp. 135–141, Mar. 1976.
Trifunovic, Velimir and Jokanovic, Branka, "Review of Printed Marchand and Double Y Baluns: Characteristics and Application," *IEEE Transactions on Microwave Theory and Techniques*, vol. 42, No. 8, pp. 1454–1462, Aug. 1994.
Staudinger, Joe and Costa, Julio, "Lumped–element networks compose wide–bandwidth balun," *Microwaves & RF*, pp. 119–126, Sep. 1993.
Ho,Fan & Chang, "Broad–Band Uniplanar Hybrid–Ring and Branch–line Couplers," *IEEE Transactions on Microwave Theory and Techniques*, vol. 41, No. 12, pp. 2116–2124, Dec. 1993.

*Primary Examiner*—Paul Gensler
*Attorney, Agent, or Firm*—Bucknam and Archer

[57] ABSTRACT

The invention proposes a lumped constant compensated high/pass balun (balance line to unbalance line transition). The proposed circuit can be used in microwave integrated circuit(MIC) and mononolithic microwave integrated circuit (MMIC) designs. The basic operating principle of the proposed circuit is to use two sets of lumped type high pass and low pass filters to synthesize a microwave balun. The first filter set provides the wide band 180° phase difference property for the balun circuit. The amplitude imbalance of the balun is compensated by the other filter set. The advantage of the proposed circuit is to replace the bulky and non-planar distributed balun or traditional transformer in low microwave frequency range.

12 Claims, 41 Drawing Sheets

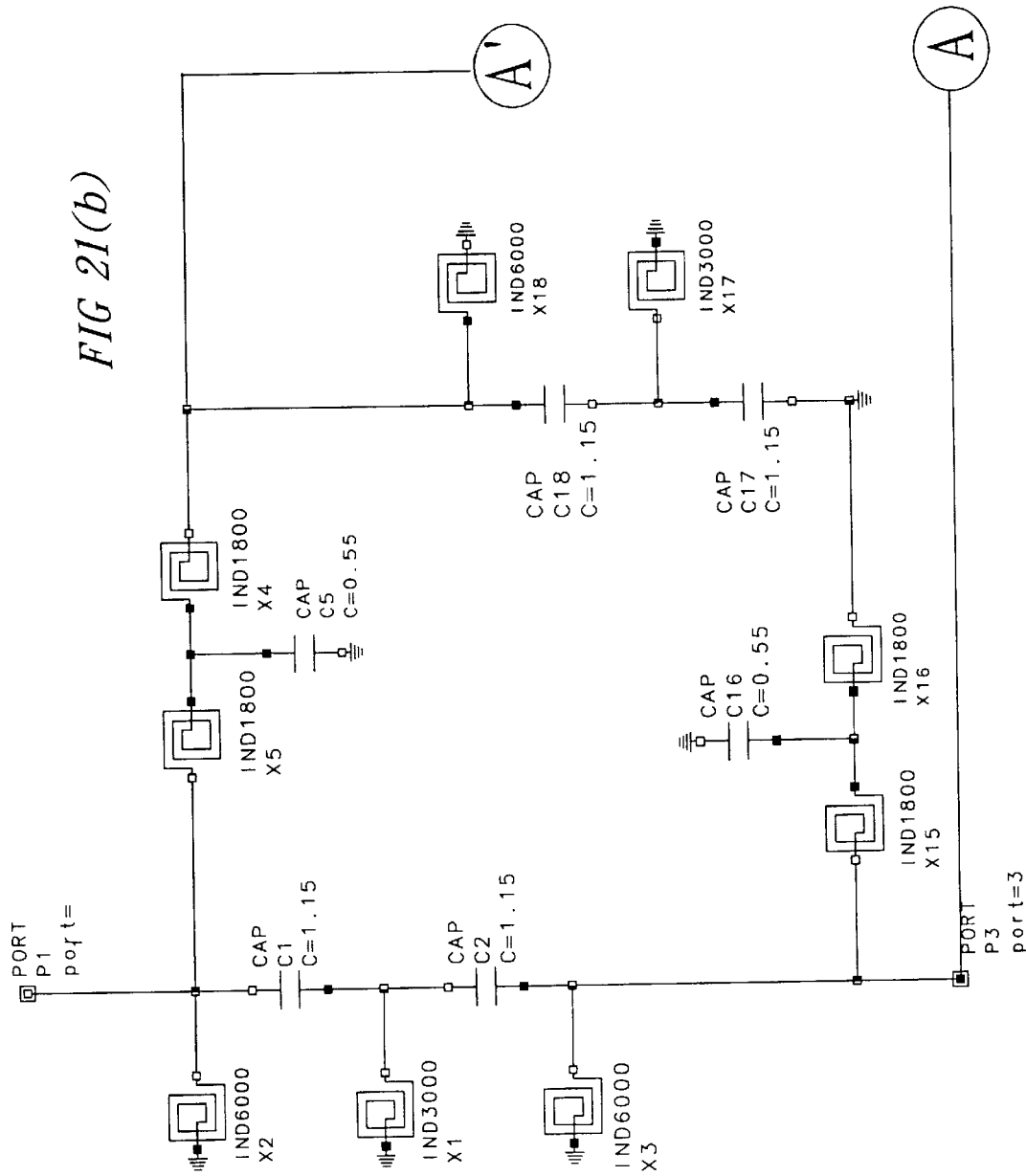

LUMPED CONSTANT COMPENSATED HIGH/LOW PASS BALANCED-TO-UNBALANCED TRANSITION

BACKGROUND OF THE INVENTION

1. Field of the Invention

The invention proposes a circuit to offer a simple, lumped-element circuit, for use in a monolithic microwave integrated circuit.

2. Description of the Prior Art

N. Marchand published in 1944, "Electronics, " Volume 17, p.12, that a device similar to a transformer that can supply phase-differential but with equal amplitude signal, and simultaneously convert impedance. This is the so-called balanced line-to-unbalanced line transition, shortened to Balun. Later on, S. A. Mass reported in 1992, "Microwave Mixers" second edition, that balun can be widely applied to microwave frequency mixers, phase-differential detector, frequency transformer, and compensated frequency transformer. In addition, K. Tilley et al. reported in 1994 "Electronics Lett." Volume 30, No.3, pp. 176–177, that balun can also be used in the design of progressive amplitude and antenna transmission circuits.

Earlier balance-to-unbalance line transitions use coaxial line structure, or use one or multiple quarter bandwidth combination transmission lines. After several decades' development, balanced line-to-unbalanced line transition balun) has evolved many varieties, which can be classified as the following five types:

1. Broadside coupled-lines type, published by C. Y. Ho in 1985, "Microwave & RF " pp.99–102 and repeatedly covered by other researchers.
2. Marchand type, covered by J. H. Cloete in 1979 at European Microwave Conf. Proc., p. 480 and also covered by other researchers extensively.
3. Double-Y junction type, covered by V. Trifunovic et al. in 1991, "Electronics Lett. " Volume 27, No. 10, pp. 813–815.
4. Active type, as covered by J. Staudinger et al. in September of 1993's, "Microwave Journal" pp. 119–126.
5. Lumped element 180° hybrid, or lumped type, high/low-pass balun, covered by J. A. Eisenber et al. in September of 1992's, "Microwave Journal, pp. 123–131.

The former three balanced line-to-unbalanced line transitions(Balun) are still designed with distributed transmission lines, which is a non-planar circuit design. At lower microwave frequencies (for example 2.0 GHz or below), this type of balanced line-to-unbalanced line transition becomes bulky in size, and unsuited for designing the monolithic microwave integrated circuit. The active type (fourth type) has many problems in the areas of stability, intermodulation, and impedance match. The fifth type of balanced line-to-unbalanced line transition takes 180° hybrid circuit and uses lumped elements to replace a quarter wavelength transmission line. This type of balanced line-to-unbalanced line transition tends to produce larger phase error when it gets farther away from the center frequency while lumped type high/low-pass balun uses high-pass/low-pass filter and diplexer theories in design, but it does not satisfy the phase and frequency match simultaneously.

Balanced-line to unbalanced-line transition (balun) circuits can be widely applied to microwave circuit and antenna applications, microwave frequencies have a similar function to the low frequencies in a transformer except that their structures are difficult to be made into a two-dimensional form. It is usually transmitted by two-types of transmission lines, Hwann-Kaeo Chiou et al. in November of 1995's, "Electronics Lett." Volume 31, No. 24, pp. 2113–2114 and other researchers have covered in regard to the transition between coax/cpw/slot/cps. The transition of these lines invariably required a quarter wavelength line, which causes the balanced-line to unbalanced-line transition (balun) to be a bulky two-dimensional or even three-dimensional structure. Their model characteristics cannot be easily simulated; therefore, in design, it usually requires experience to fine-tune it. The aforementioned difficulties make applying the balanced-line to unbalanced-line transition to the design of monolithic microwave integrated circuit difficult. Microwave balun design applied in monolithic microwave integrated design often uses a 180° magic T-circuit, or an active balanced-line to unbalanced-line transition. Although the latter has a compact advantage there are many shortcomings, such as narrow frequency bandwidth, requiring D.C. bias, different impedance level, and full control of noise figure effect.

BRIEF SUMMARY OF THE INVENTION

Therefore, the object is to seek a compact, planar, uncomplicated-design structure for balanced line-to-unbalanced line transition that can be combined with computer aided design simulation software. This is especially important to the design of microwave integrated circuits and monolithic microwave integrated circuits.

The proposed circuit structure uses lumped elements to replace bulky non two-dimensional distributed constant balanced line-to-unbalanced line transition(balun) or traditional transformers, for use in microwave circuit design such as a frequency mixer. This is especially important to the design of monolithic microwave integrated circuits (MMIC) widely-used in the wireless communication field.

The main objective of the proposed circuit is to bring forth an easy method to adapt balance line-to-unbalance line transition by synthesizing the lumped elements, and apply it in the circuit design for monolithic microwave integrated circuits and microwave integrated circuits.

Another objective of the proposed circuit is to bring forth a circuit to replace bulky, non planar distributed constant balance line-to-unbalance line transition(balun) or traditional transformers, to use lumped elements in making the microwave circuit design layout for frequency mixer. This is especially important for the design of monolithic microwave integrated circuits used in the wireless communication field.

The basic operating principle of the proposed circuit is to use two sets of lumped type high-pass and low-pass filters to synthesize a microwave balun. One set of lumped type high-pass and low-pass filter is synthesized to the traditional high/low-pass balun, and another set of high/low-pass balun are connected to the low/high-pass filter's two output ports. This compensated high/low-pass filter structure can achieve amplitude match and 180° phase differential balance output. By carefully choosing its characteristics for the impedance value, it is then possible to determine the impedance transfer ratio for the balanced-line to unbalanced-line transition (balun).

8 . . . Balance-to-unbalance line transition with impedance Zt (Balun Zt)

9 . . . Unbalanced line impedance(RS)

Figure 2:
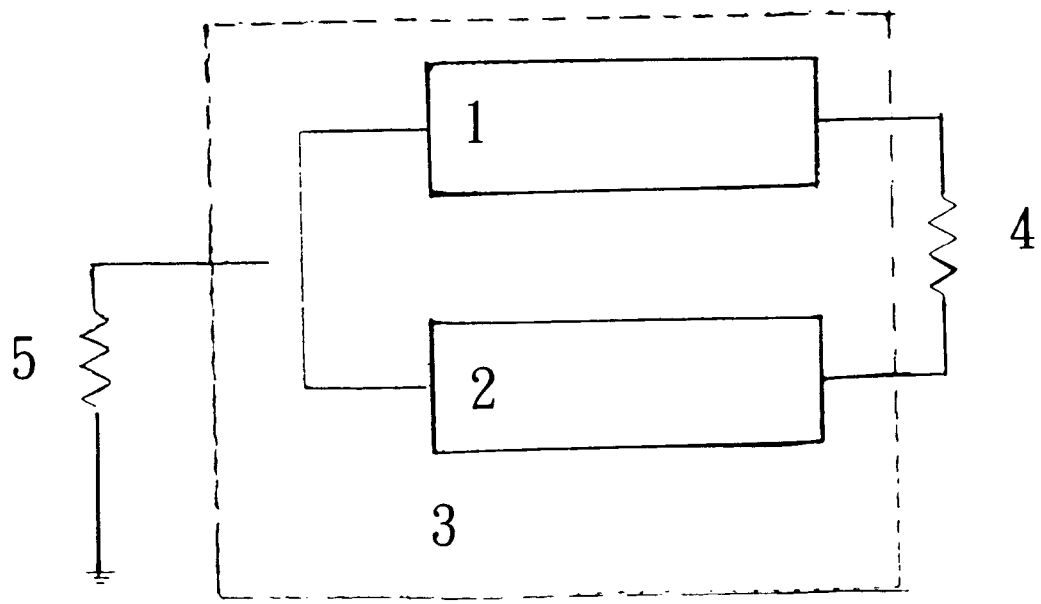
Figure 3:
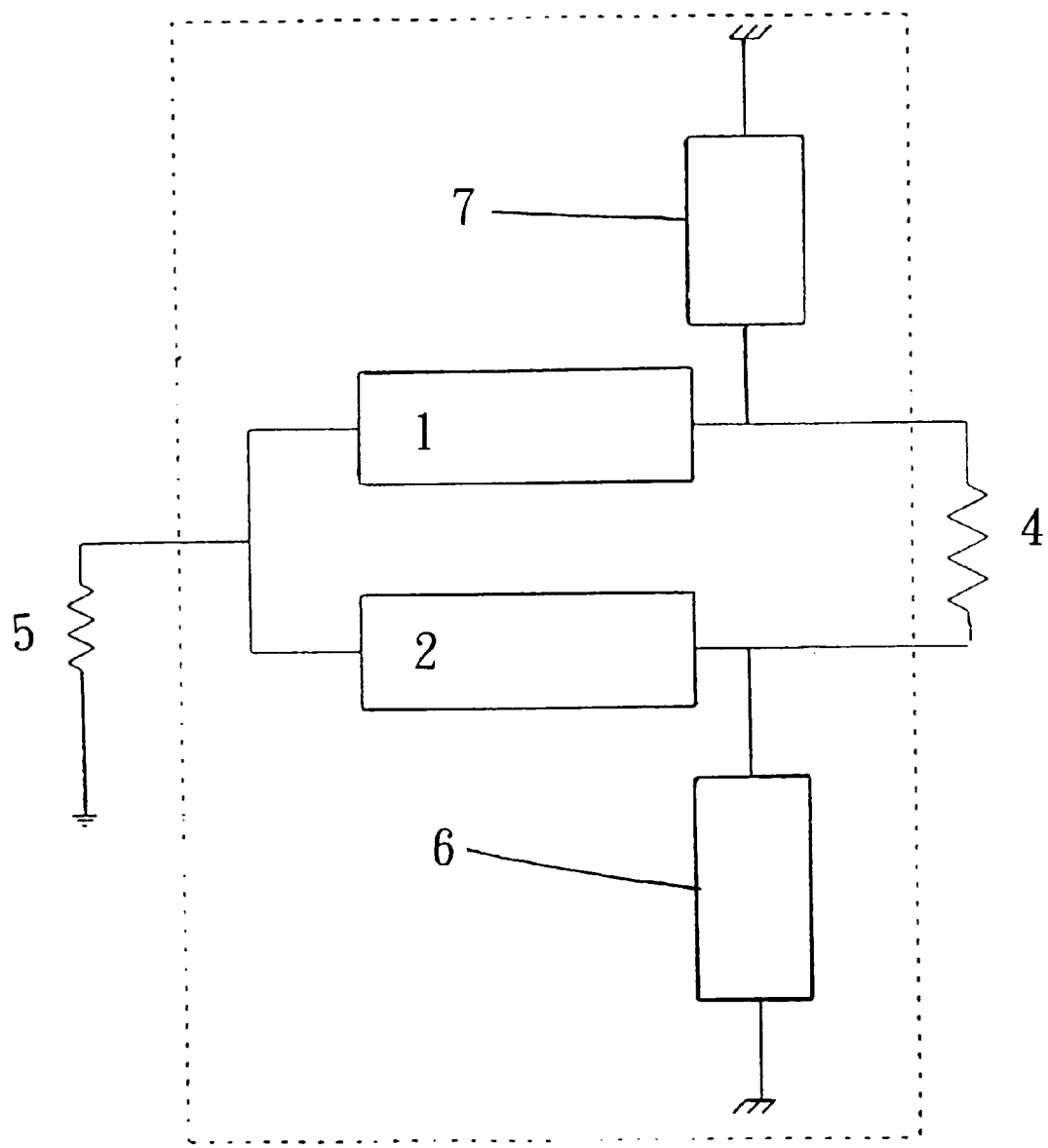
Figure 4A:
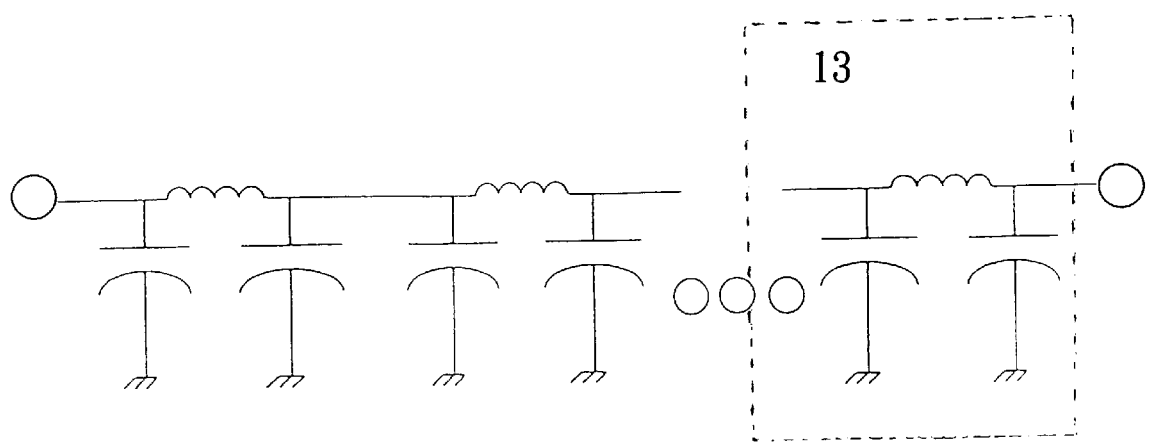
Figure 4B:
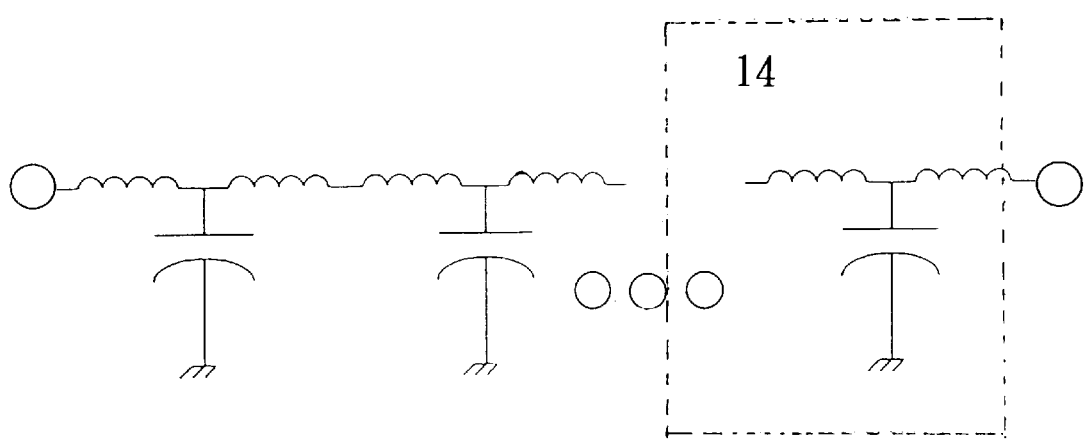
Figure 5A:
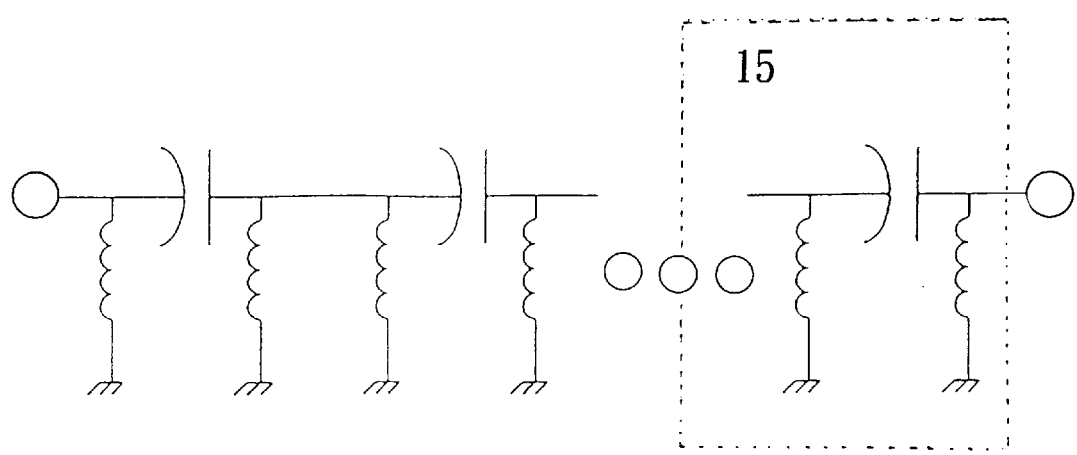
Figure 5B:
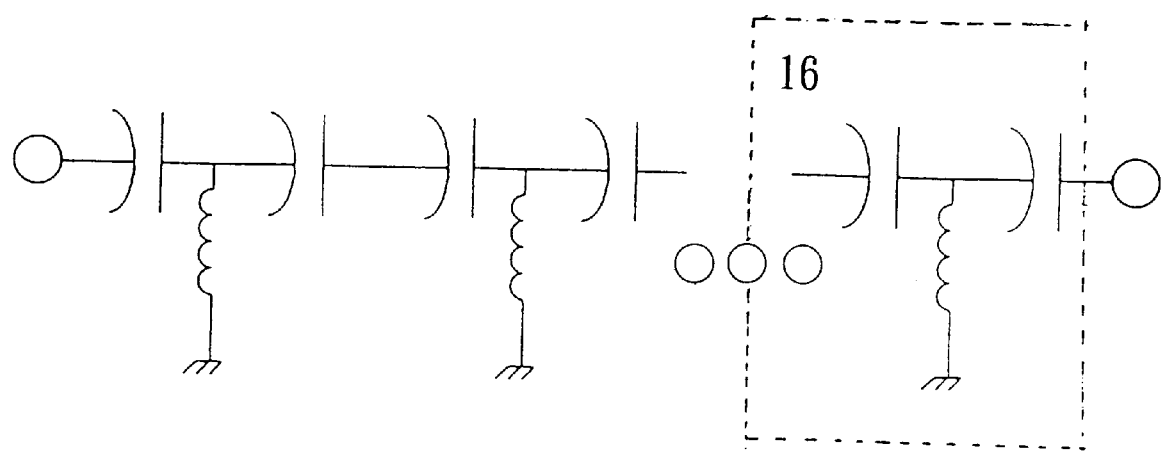
Figure 6:
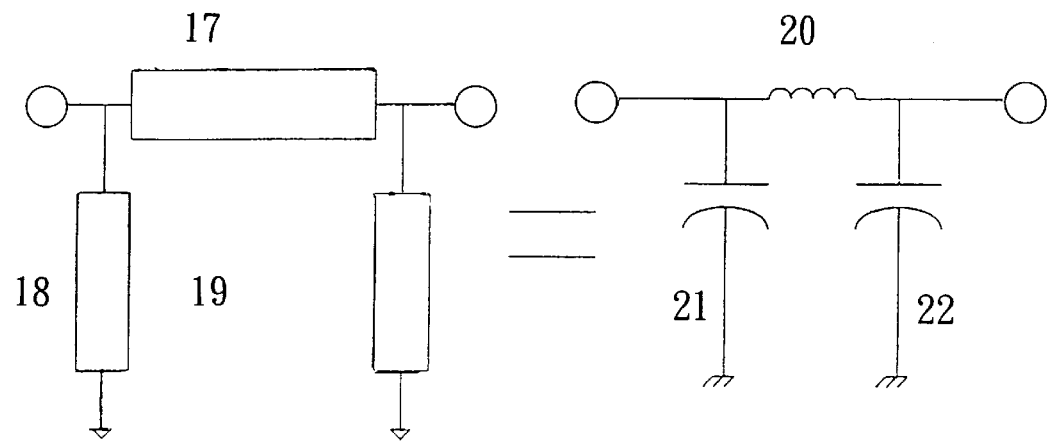
Figure 6:
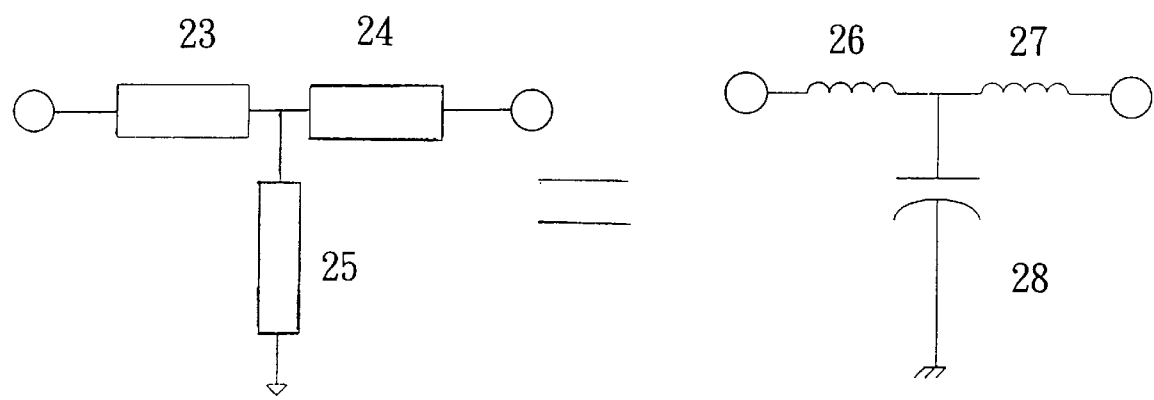

10 . . . Balance impedance(RL)
11 . . . Unbalanced line
12 . . . Balanced line
($Zt^2=RS \times RL$) The mathematical relation between Balance-to-unbalanced impedance value and unbalance/balance impedance FIG. 2 is a diagram of High/low-pass filter balance-to-unbalance line transition illustration 1 . . . High-pass filter
2 . . . Low-pass filter
3 . . . high/low-pass Balun
4 . . . RL balanced impedance
5 . . . Rs unbalanced impedance FIG. 3 is a diagram of Compensated high/low-pass balanced-to-unbalanced line transition 6 . . . Compensated High-pass filter
7 . . . Compensated Low-pass filter FIGS. 4(a)–4(b) is a diagram of Pi type and T type lumped constant low-pass filter FIG. 4(a) Pi type lumped constant low-pass filter original form FIG. 4(b) T type lumped constant low-pass filter original form 13 . . . Pi type lumped constant low-pass filter original form
14 . . . Pi type basic section of low-pass filter FIGS. 5(a)–5(b) is a diagram of Pi type and T type lumped constant high-pass filter FIG. 5(a) Pi type lumped constant high-pass filter original form FIG. 5(b) T type lumped constant high-pass filter original form 15 . . . Pi type basic section of high-pass filter
16 . . . T type basic section of high-pass filter FIG. 6 is a diagram of Pi type and T type quasi-transmission line Conversion of lumped constant low-pass filter illustration 17 . . . $jZ_0 \sin(\theta)$
18 . . . $jY_0 \tan(\theta/2)$
19 . . . $jY_0 \tan(\theta/2)$
20 . . . $L=jX$
21 . . . $C/2=jB/2$
22 . . . $C/2=jB/2$
22 . . . $jZ_0 \tan(\theta)$
24 . . . $jZ_0 \tan(\theta/2)$
25 . . . $jY_0 \sin(\theta)$
26 . . . $L/2=jX/2$
27 . . . $L/2=jX/2$
28 . . . $C=jB$ FIGS. 7(a)–7(f) shows simulated characteristics for first to third level 50 to 100 Ω balanced-to-unbalanced line transition(Balun)

Figure 7A:
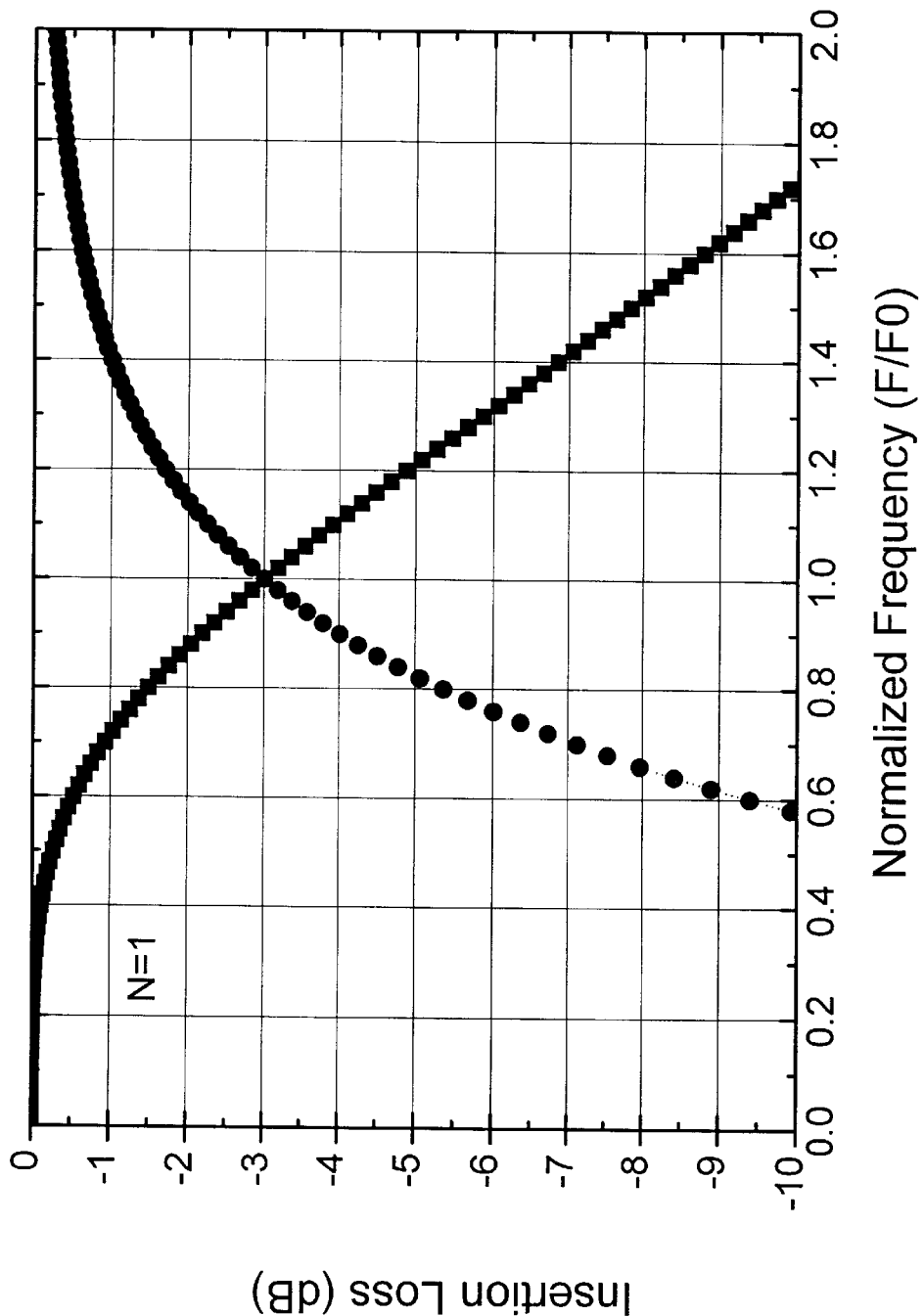

FIG. 7(a) First level balanced-to-unbalanced line transition insertion loss, N=1

Figure 7B:
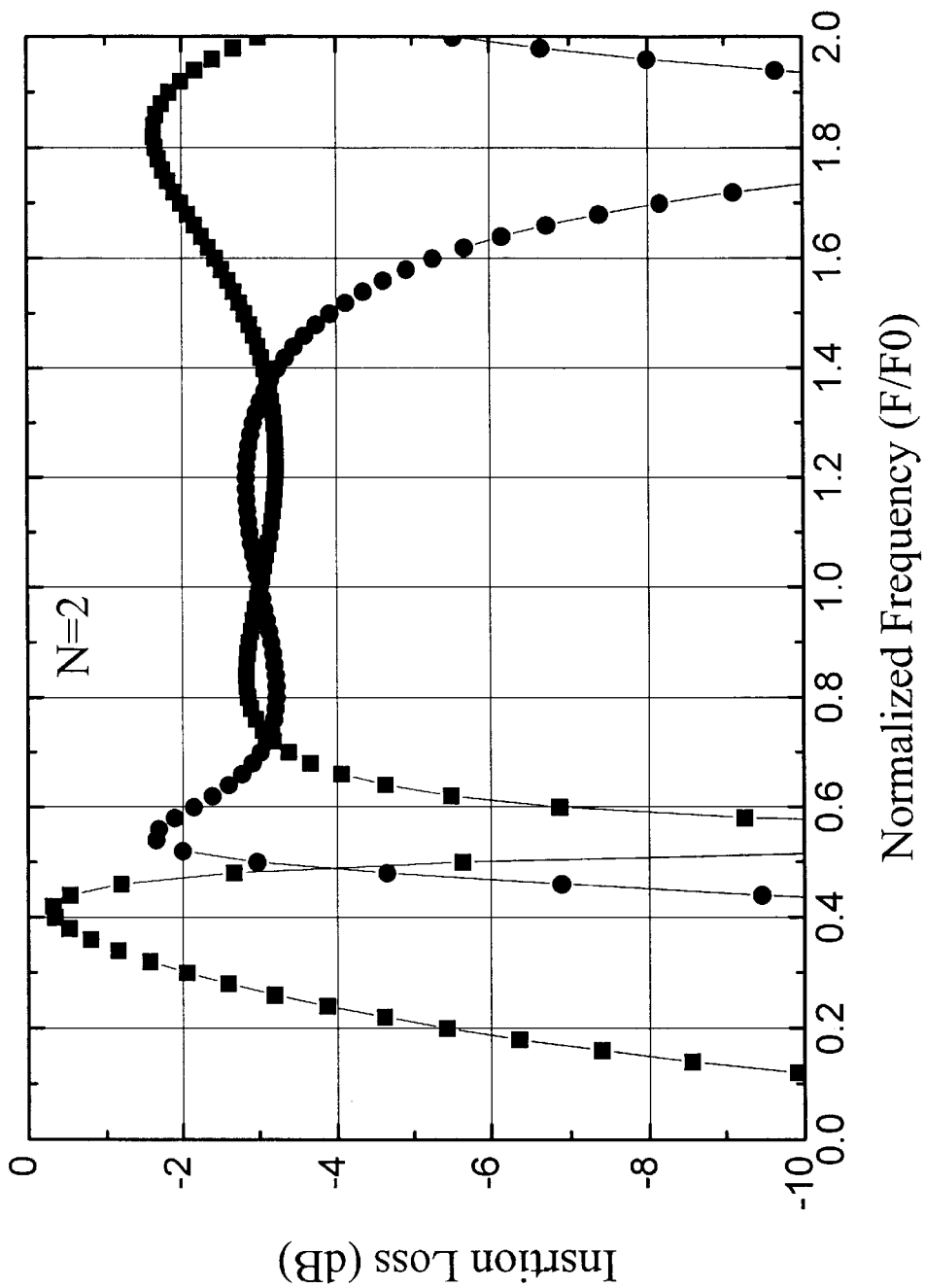

FIG. 7(b) Second level balanced-to-unbalanced line transition insertion loss, N=2

Figure 7C:
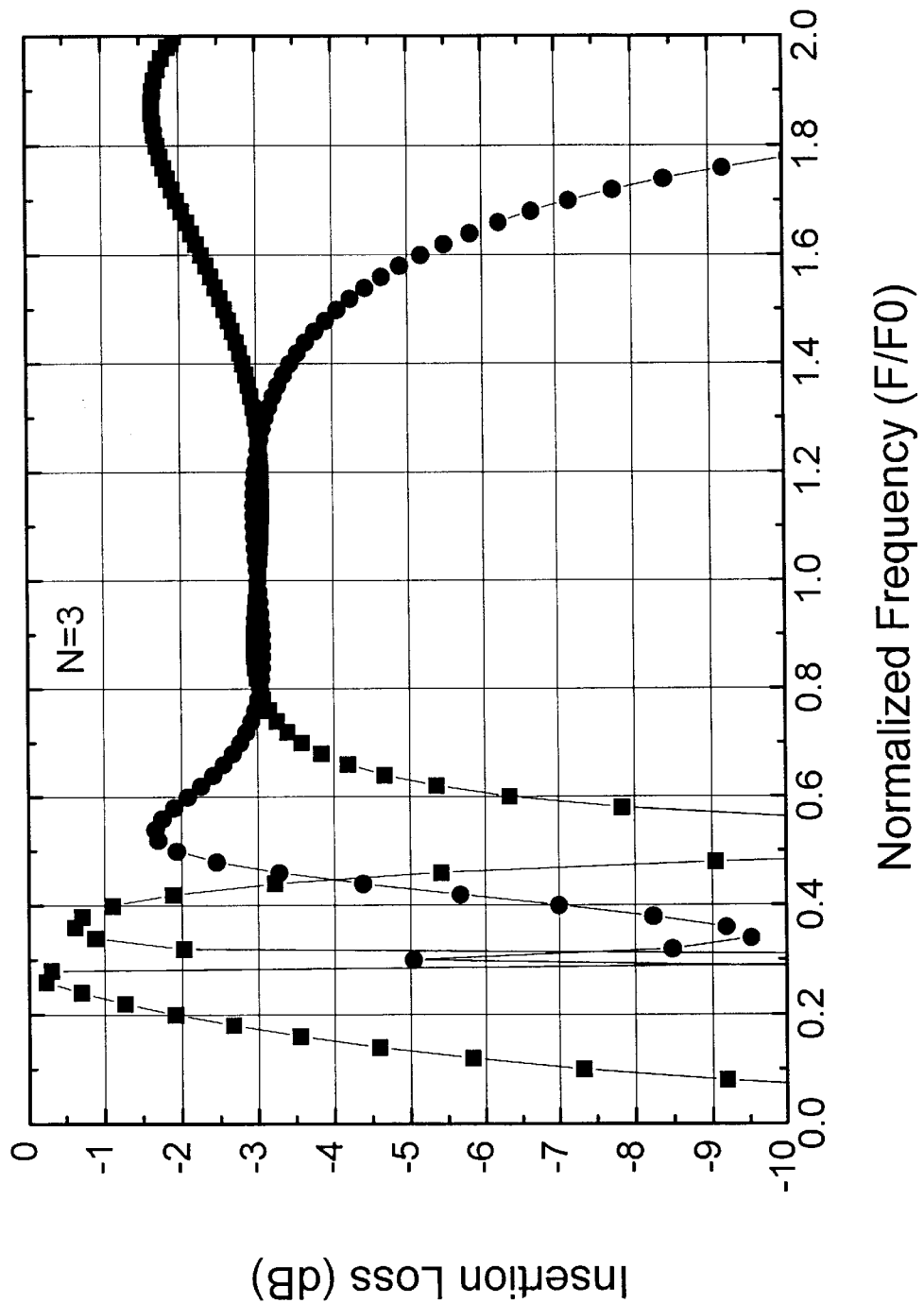

FIG. 7(c) Third level balanced-to-unbalanced line transition insertion loss, N=3

Figure 7D:
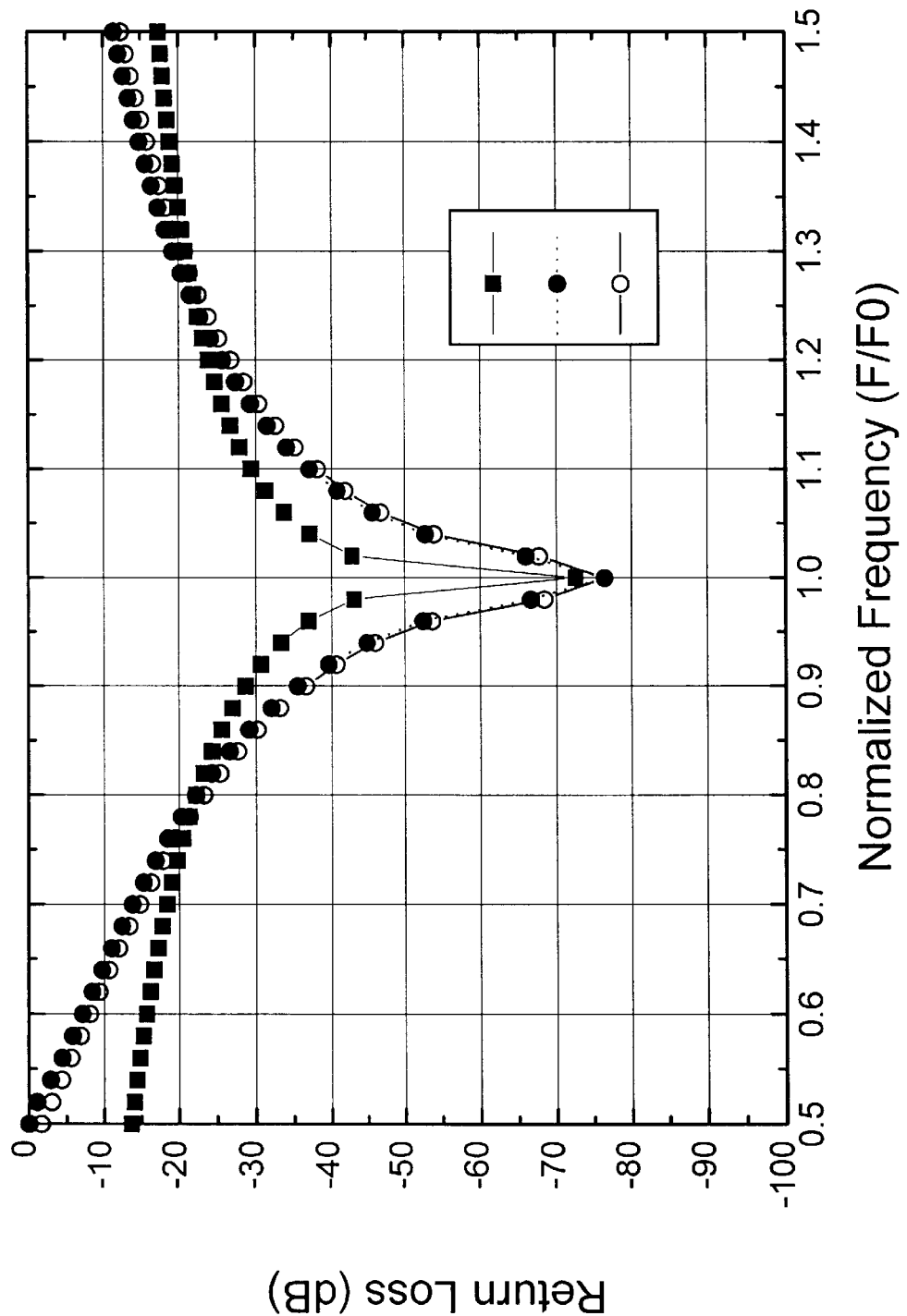

FIG. 7(d) Return loss
■ . . . N=1
● . . . N=2
○ . . . N=3

Figure 7E:
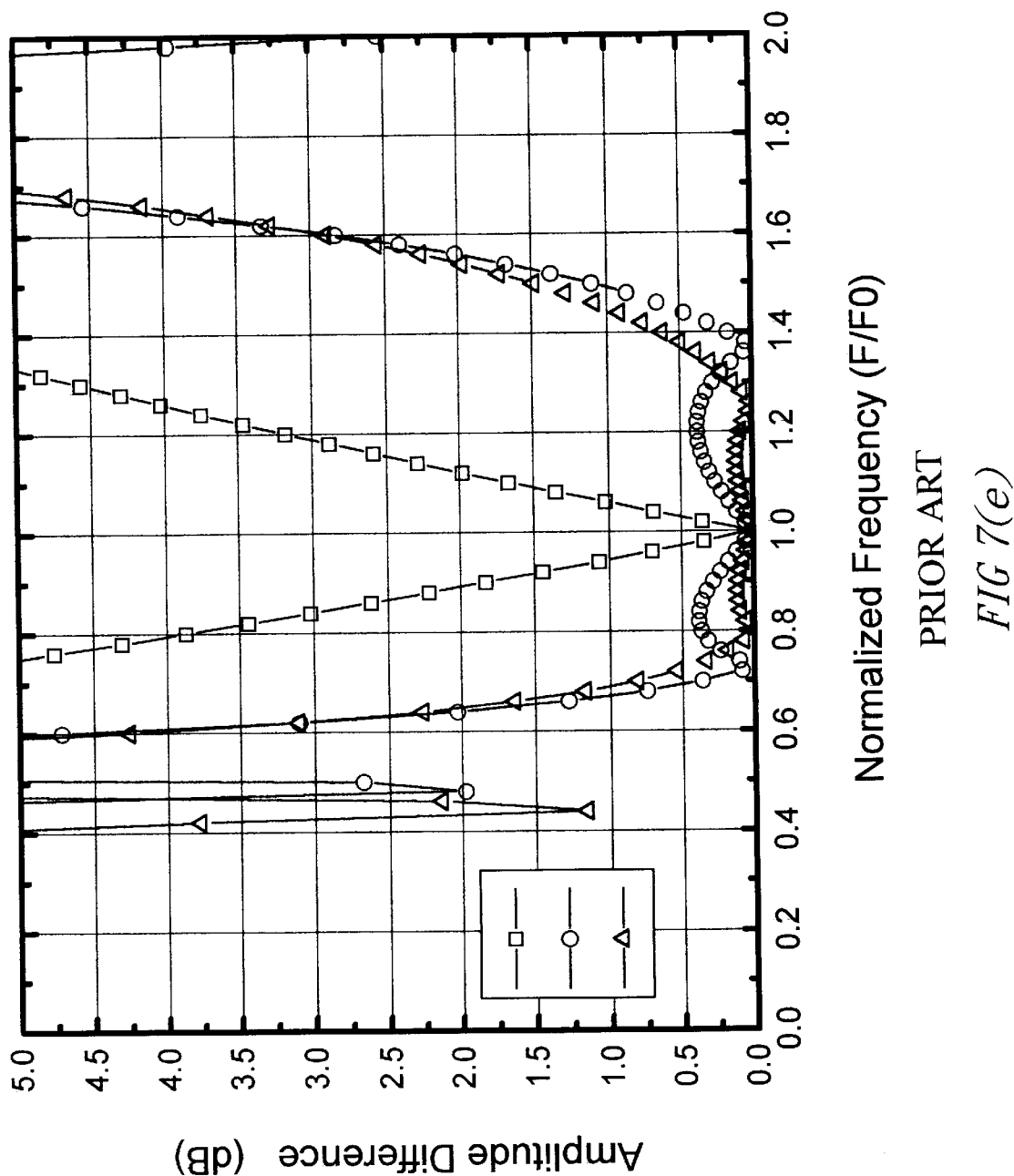

FIG. 7(e) Amplitude match
□ . . . N=1
○ . . . N=2
∆ . . . N=3

Figure 7F:
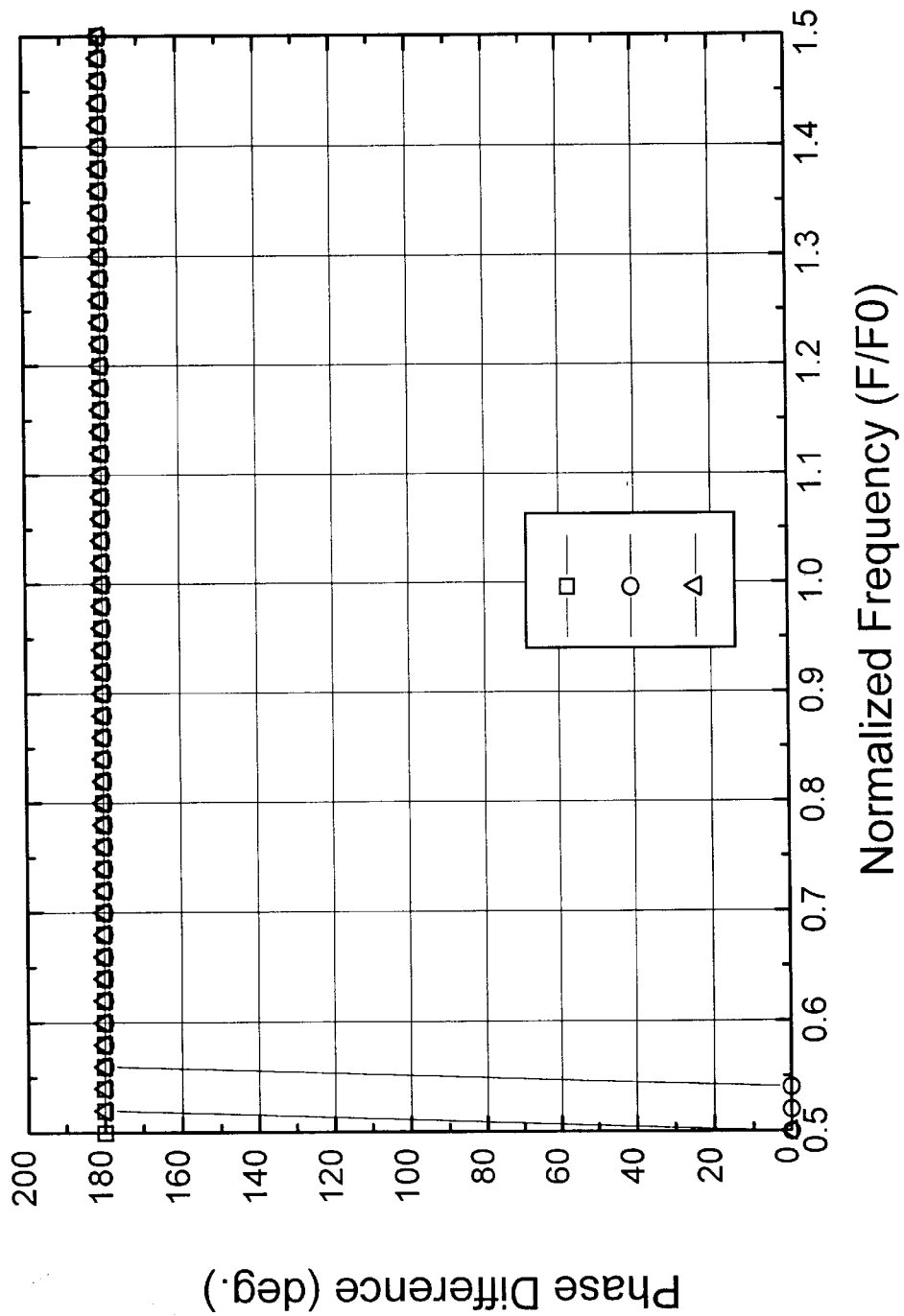

FIG. 7(f) Phase differential
□ . . . N=1
○ . . . N=2
∆ . . . N=3

Figure 8A:
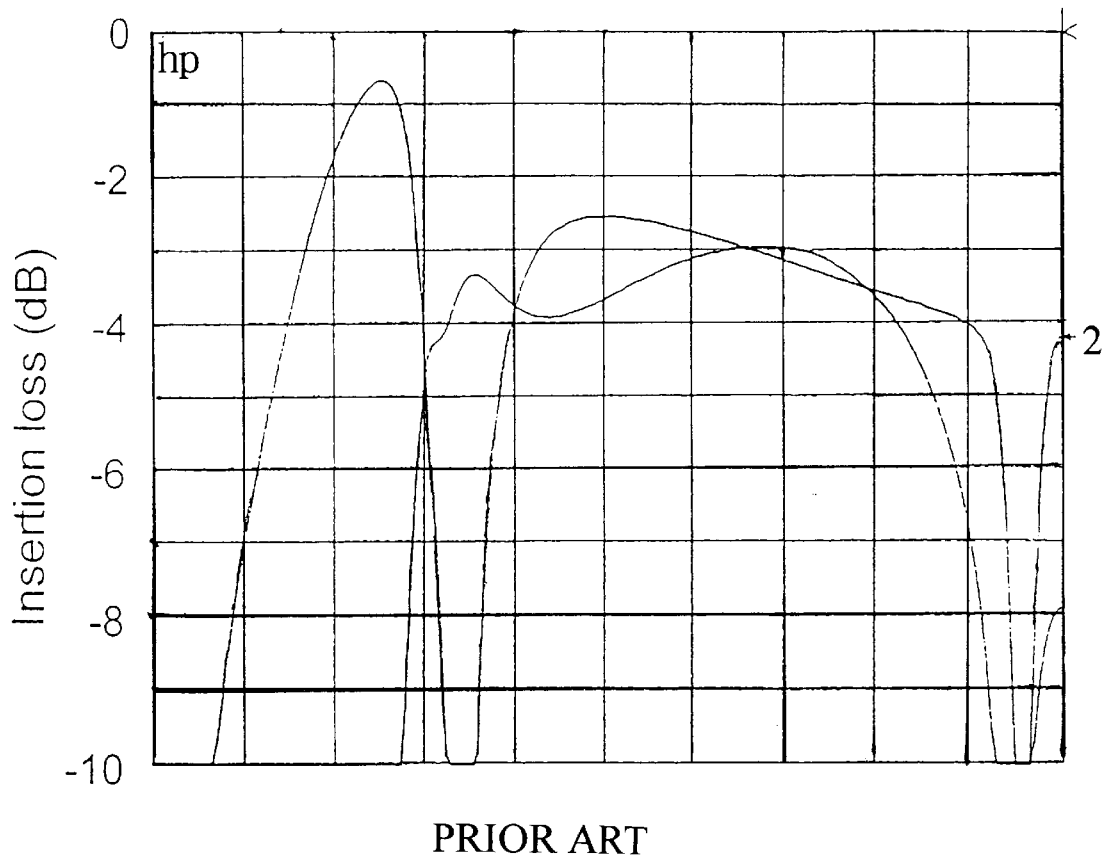
Figure 8B:
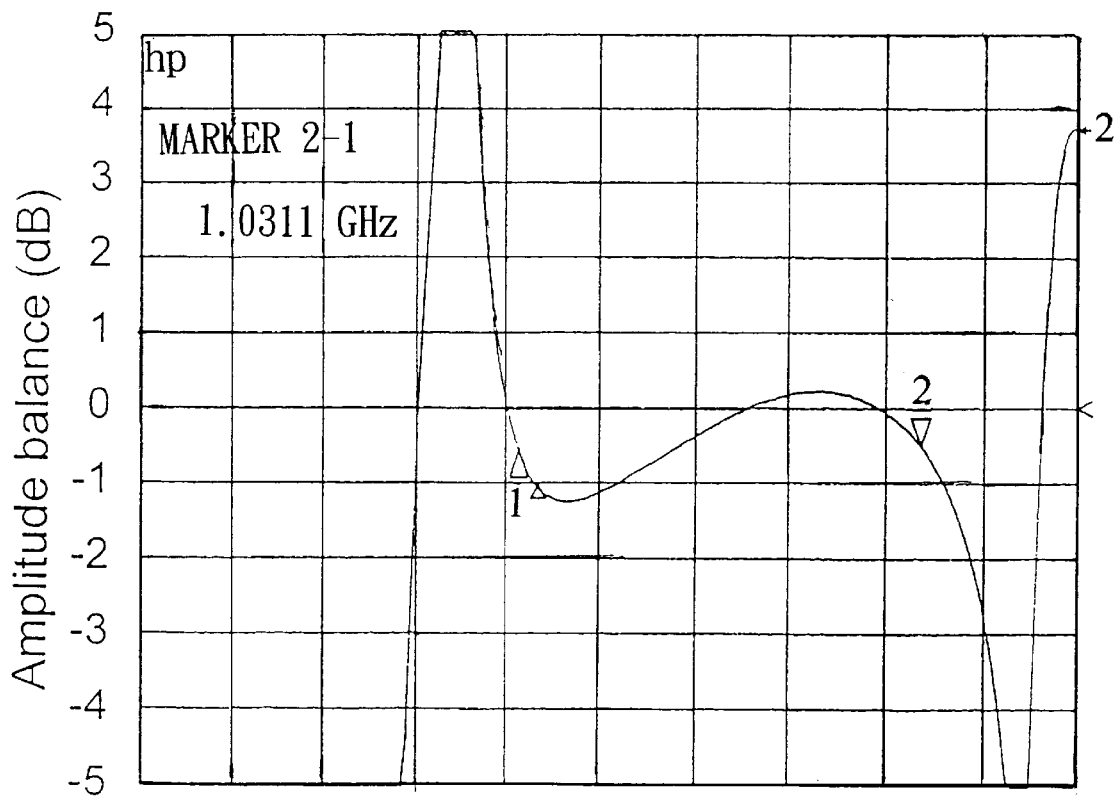
Figure 8C:
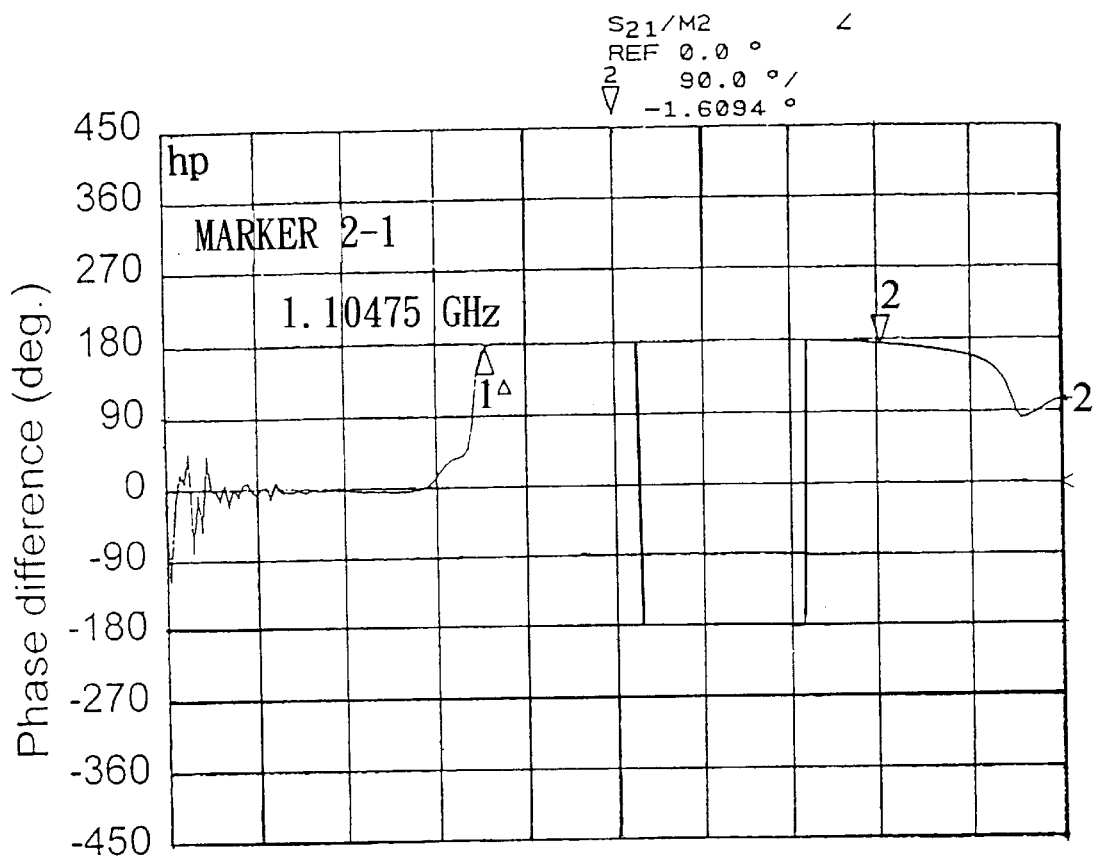
Figure 9:
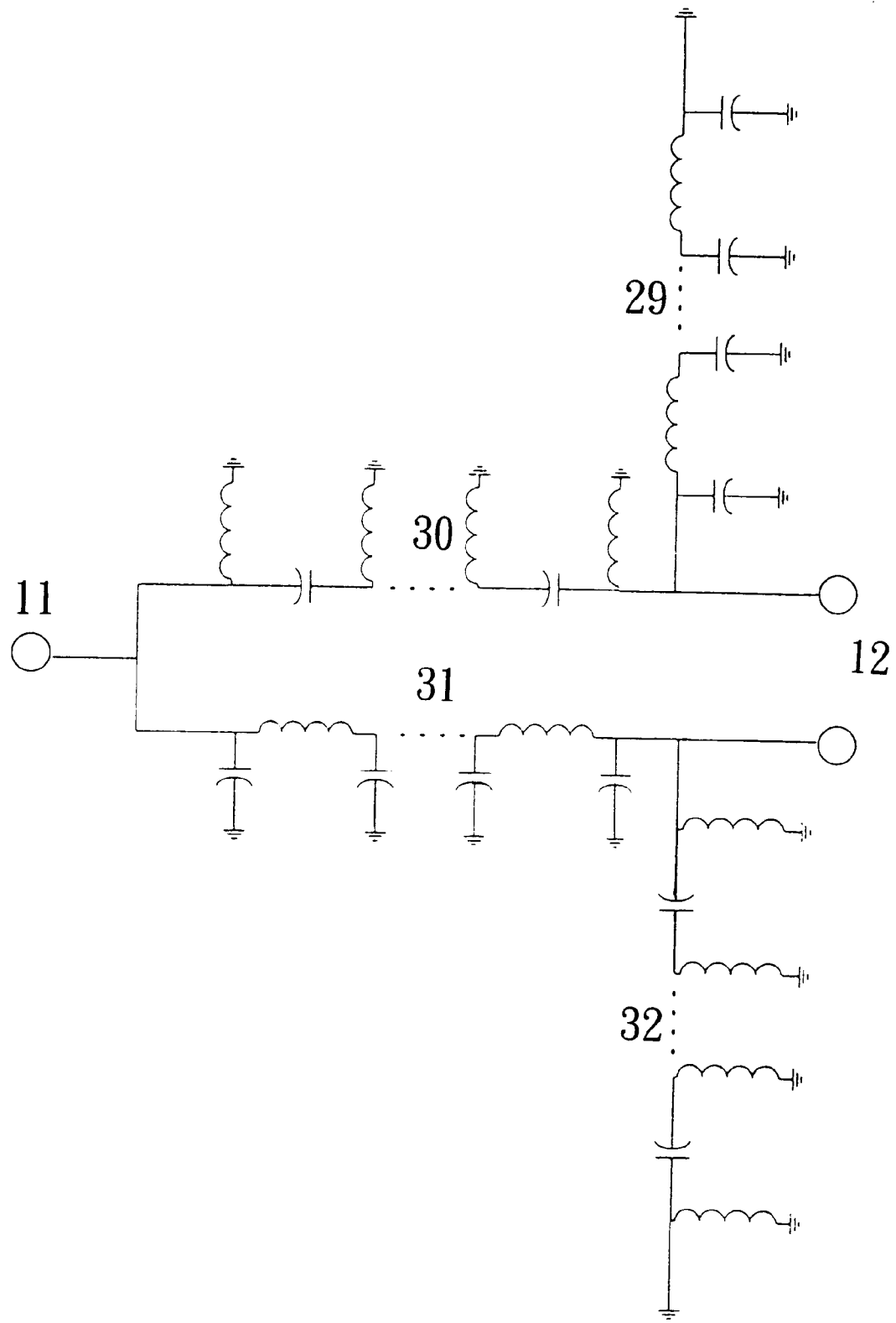
Figure 10:
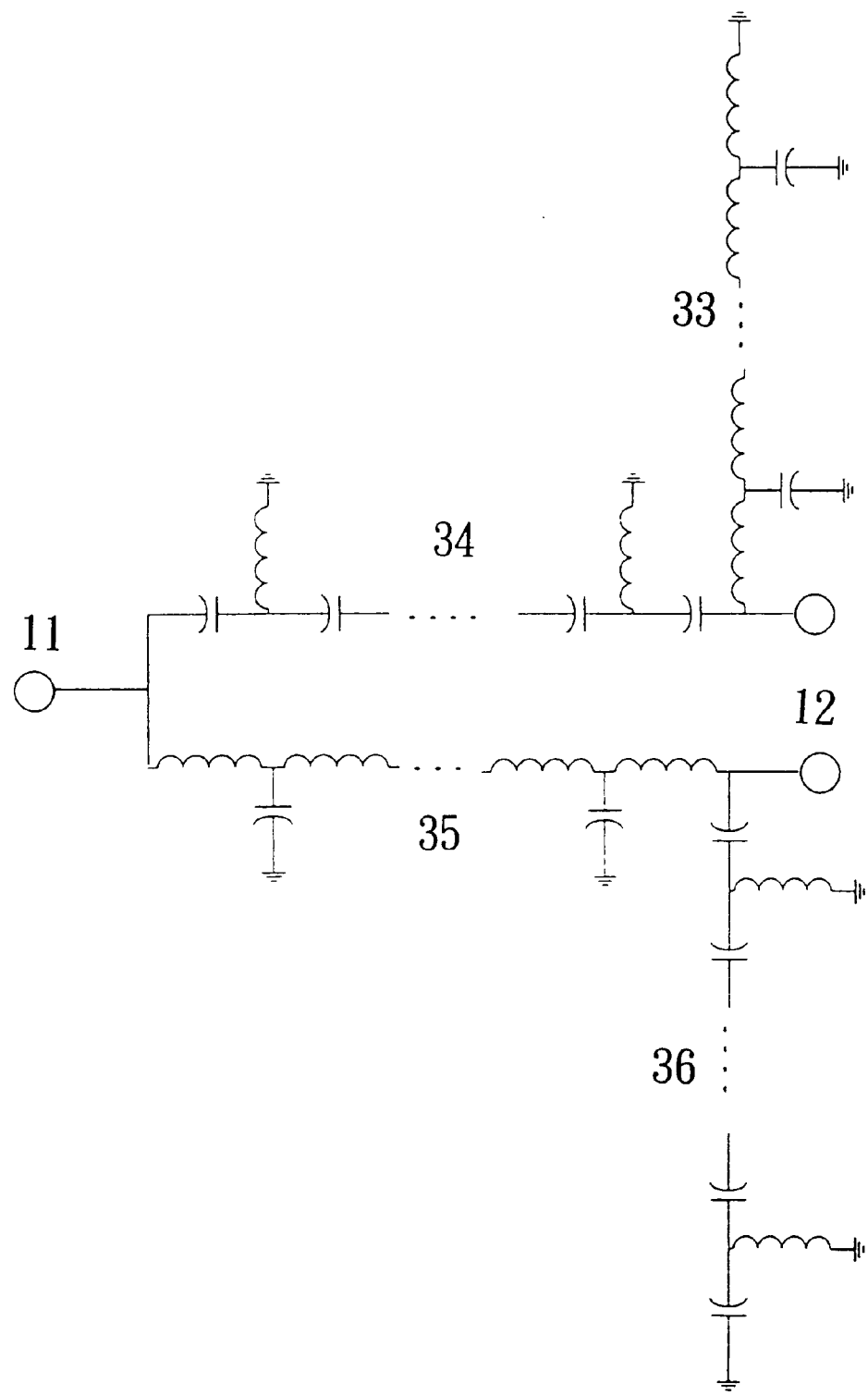
Figure 11:
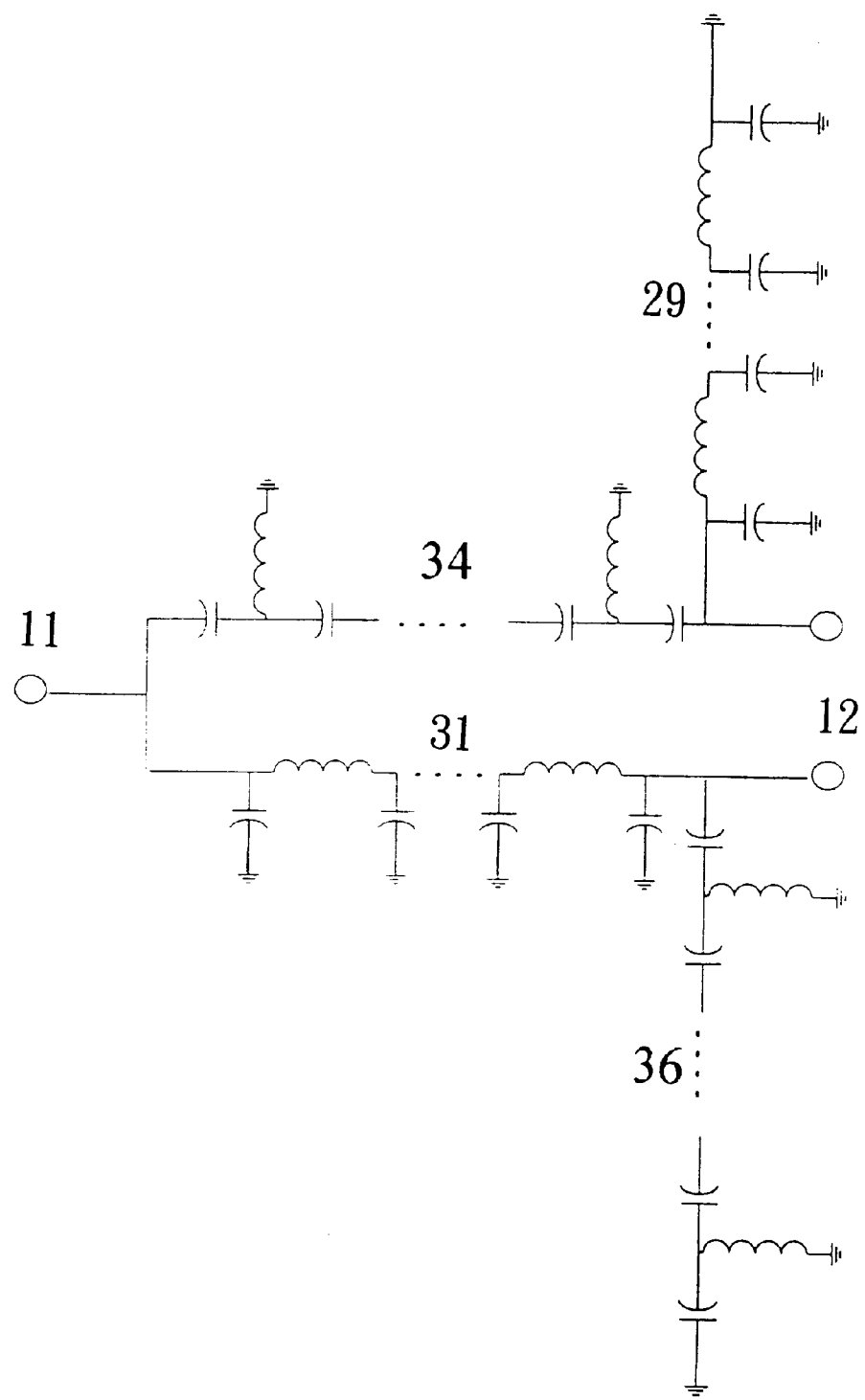
Figure 12:
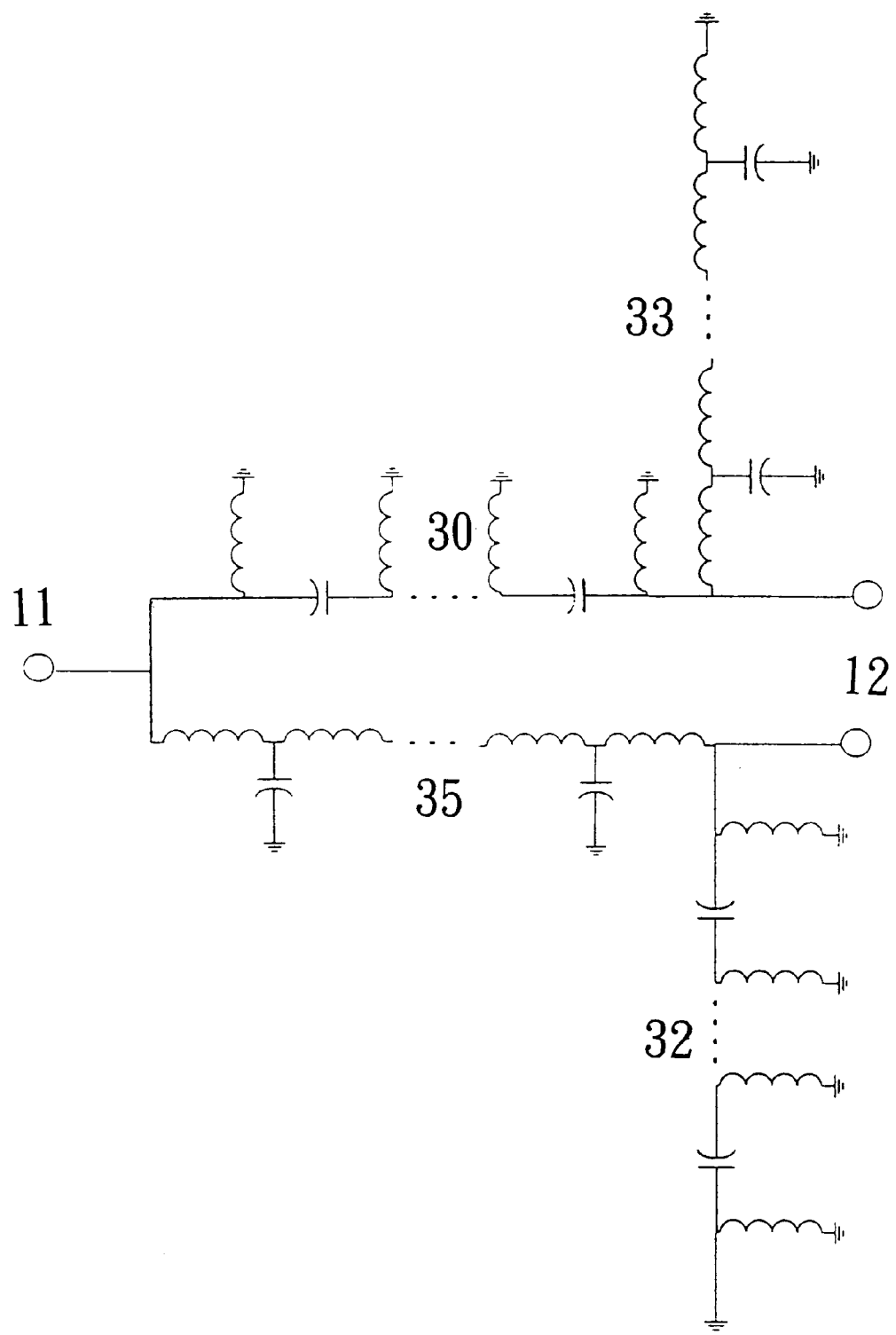
Figure 13:
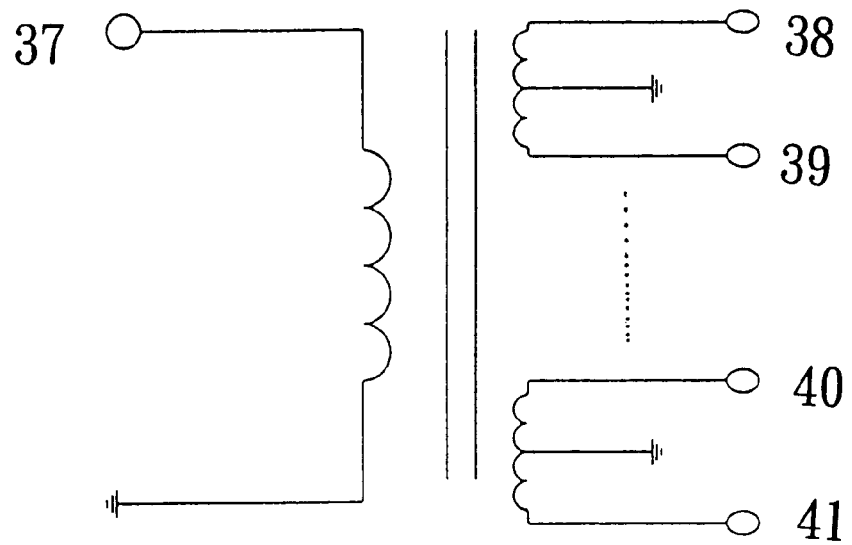
Figure 13:
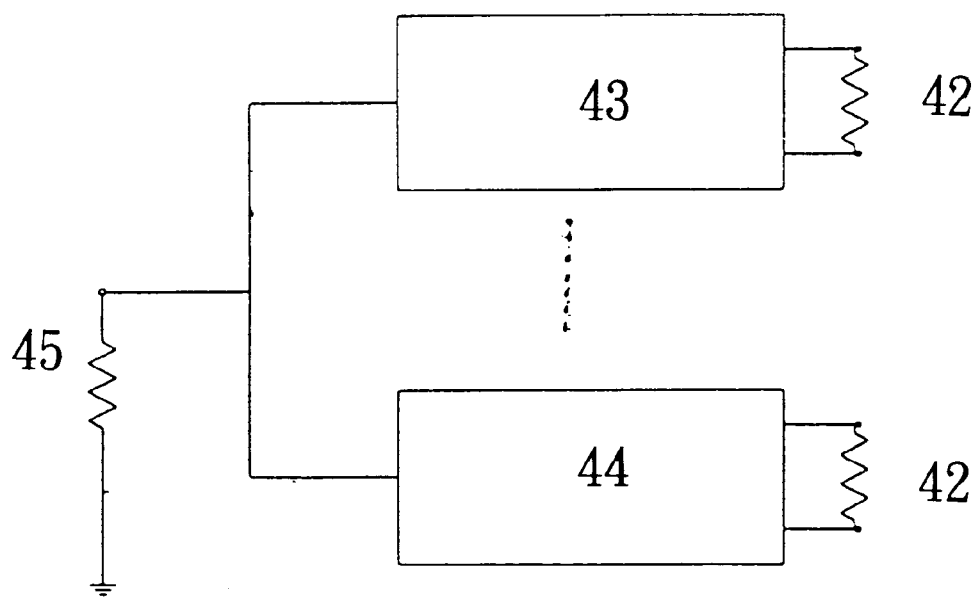

FIGS. 8(a)–8(c) is a diagram of Second level 50 to 100 Ω balance-to-unbalance line transition measurement characteristics FIG. 8(a) Insertion loss
Starting . . . 0.045000000 GHz
Ending . . . 2.500000000 GHz FIG. 8(b) Amplitude balance
Starting . . . 0.045000000 GHz
Ending . . . 2.500000000 GHz FIG. 8(c) Phase differential
Starting . . . 0.045000000 GHz
Ending . . . 2.500000000 GHz FIG. 9 is a diagram of PiPi type compensated high/low-pass balance-to-unbalance line schematic 29 . . . Compensated Pi type low-pass filter
30 . . . Pi type high-pass filter
31 . . . Pi type low-pass filter
32 . . . Compensated Pi type high-pass filter
11 . . . Unbalanced line
12 . . . Balanced line FIG. 10 is a diagram of TT type compensated high/low-pass balance-to-unbalance line transition schematic 33 . . . Compensated T type low-pass filter
34 . . . T type high-pass filter
35 . . . T type low-pass filter
36 . . . Compensated T type high-pass filter
11 . . . Unbalanced line
12 . . . Balanced line FIG. 11 is a diagram of T Pi type compensated high/low-pass balance-to-unbalance line transition schematic 29 . . . Compensated Pi type low-pass filter
34 . . . T type high-pass filter
31 . . . Pi type low-pass filter
36 . . . Compensated T type high-pass filter
11 . . . Unbalanced line
12 . . . Balanced line FIG. 12 is a diagram of Pi T type compensated high/low-pass balance-to-unbalance line transition schematics 33 . . . Compensated T type low-pass filter
30 . . . Pi type high-pass filter
35 . . . T type low-pass filter
32 . . . Compensated Pi type high-pass filter
11 . . . Unbalanced line
12 . . . Balanced line FIG. 13 is a diagram of Dual balanced-to-unbalanced line transition illustration 37 . . . Unbalanced line port (1/P)
38 . . . First pair balanced line positive port (O/P1$^+$)
39 . . . First pair balanced line negative port (O/P1$^-$)
40 . . . The nth pair balanced line positive port (O/Pn$^+$)
41 . . . The nth pair balanced line negative port (O/Pn$^-$)

42 . . . Balanced RL load impedance
43 . . . The first single balun with impedance Zt
44 . . . The nth single balun with impedance Zt
45 . . . Rs source impedance The mathematical relation between balanced-to-unbalanced line transition impedance and balanced impedance($Zt^2$=nRS×RL)

Figure 14:
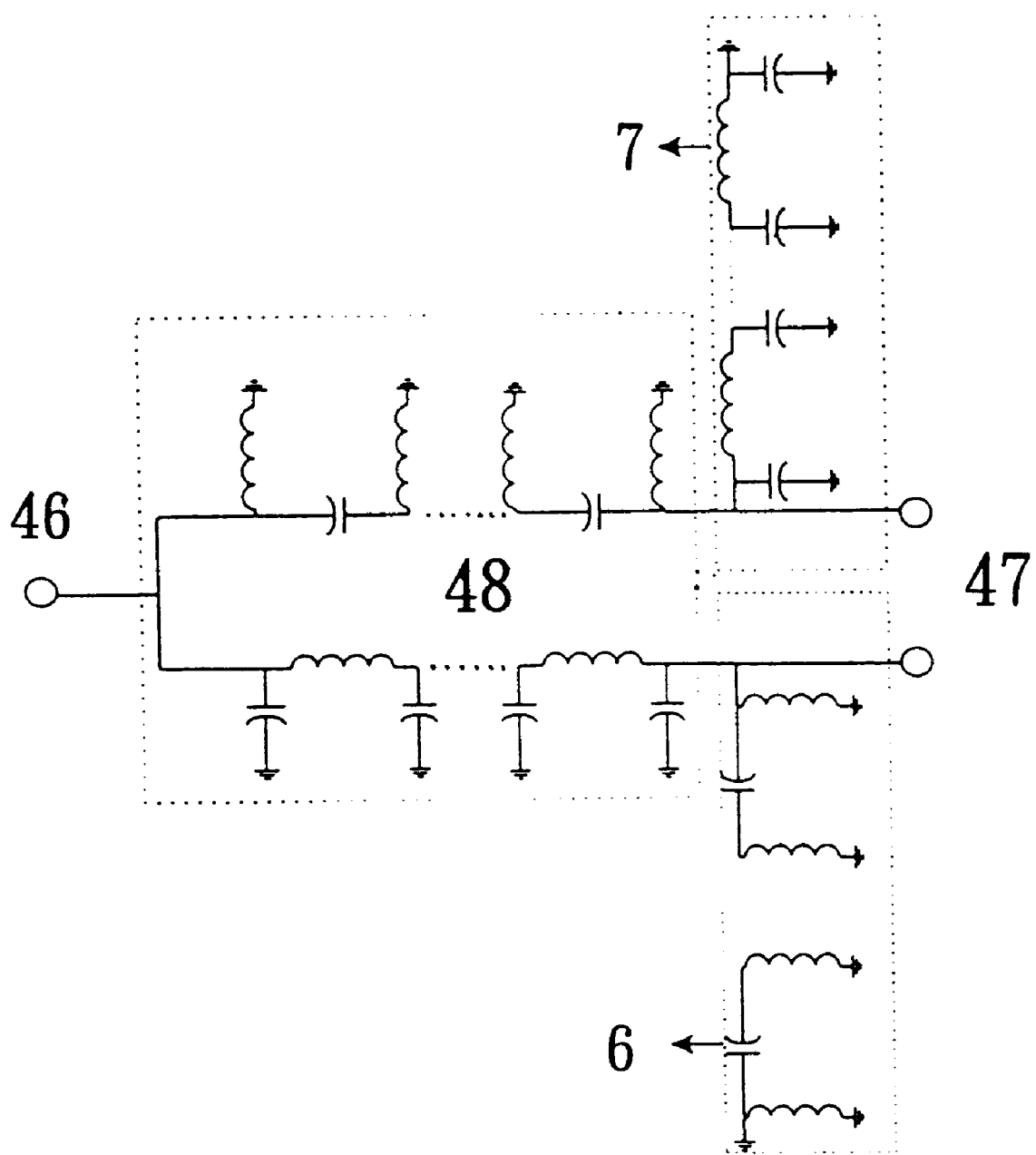

FIG. 14 is a diagram of High/low-pass filter parallel delta network

Figure 15A:
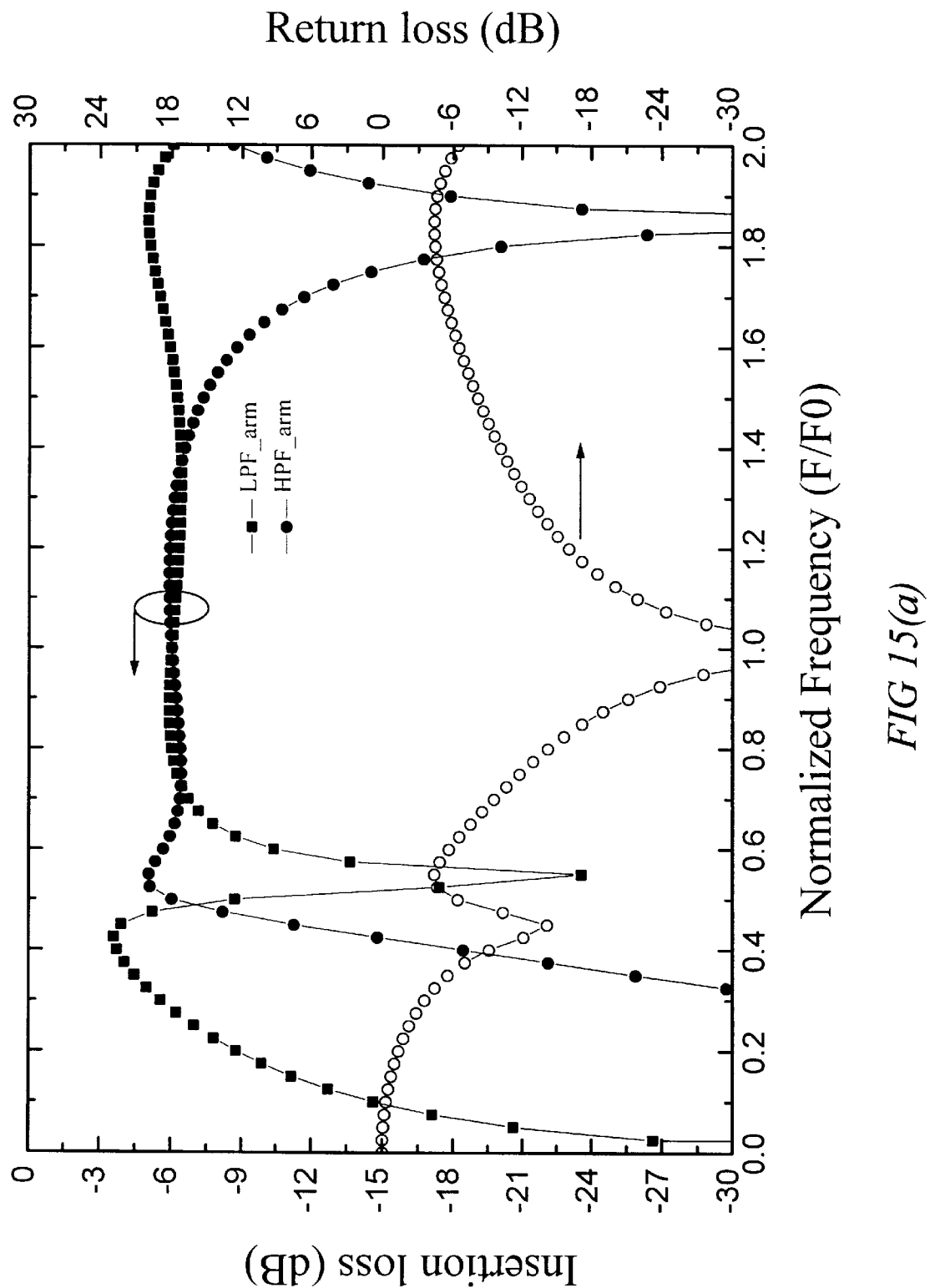
Figure 15B:
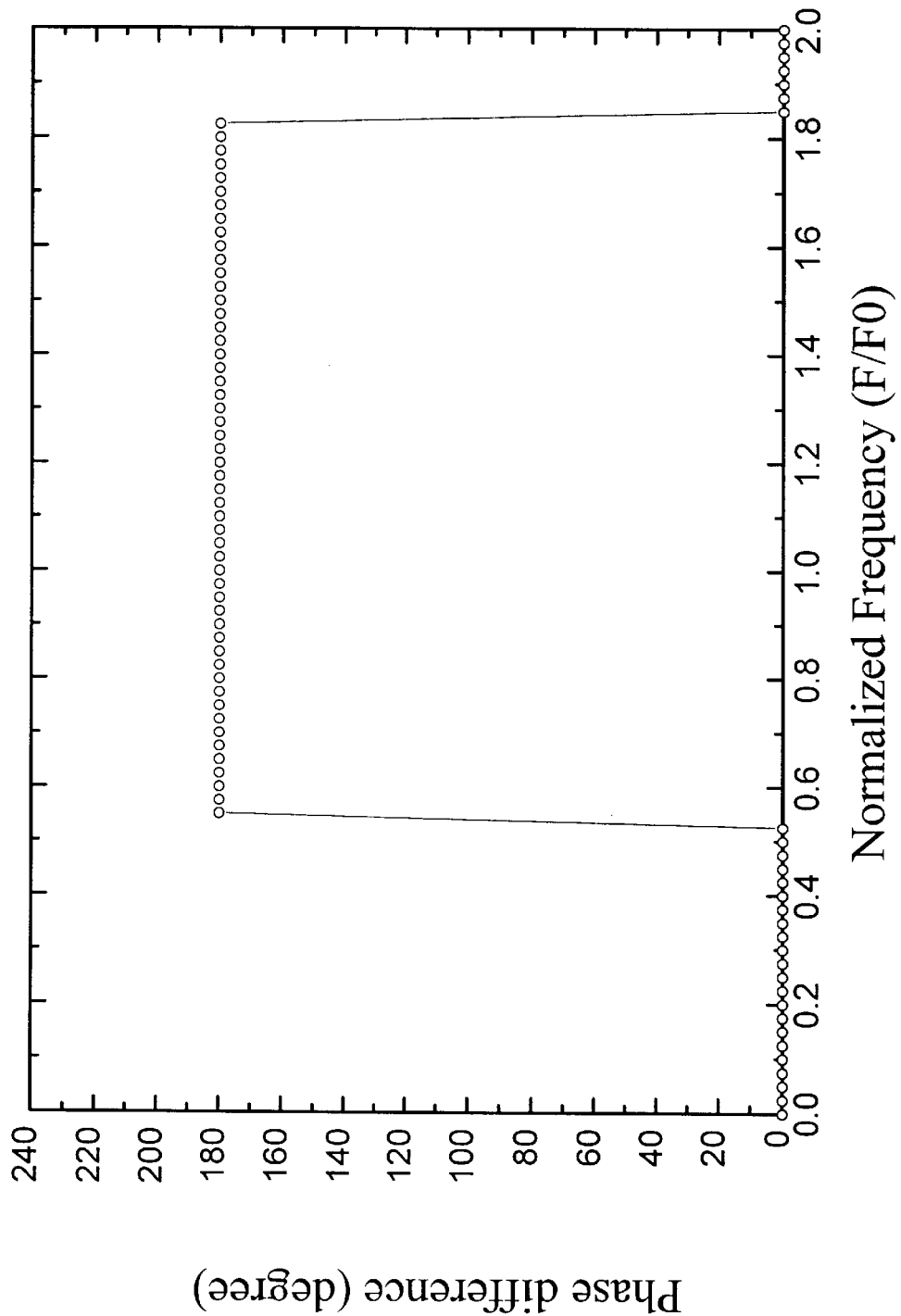

6 . . . Compensated high-pass filter
7 . . . Compensated low-pass filter
46 . . . Unbalanced port
47 . . . Balanced port
48 . . . 180° out-of-phase power splitter FIGS. 15(a)–15(b) shown simulated features of the proposed circuit FIG. 15(a) Frequency output illustration
■ . . . Low-pass filter(LPF-arm)
● . . . High-pass filter(HPF-arm)
○ . . . return loss FIG. 15(b) Simulated unbalanced phase The phase difference between Low-pass filter (LPF-arm) and High-pass filter (HPF-arm)

Figure 16A:
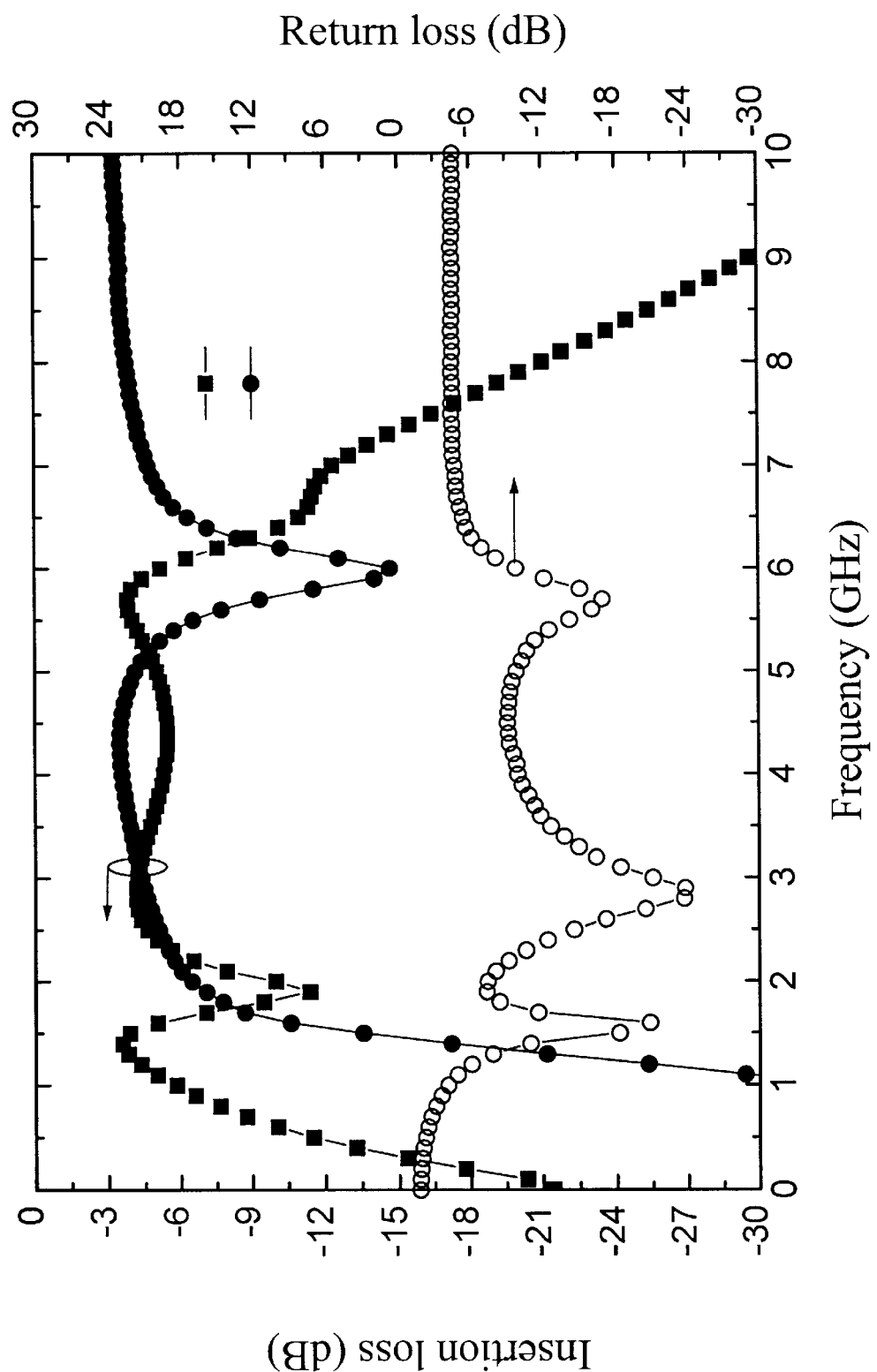
Figure 16B:
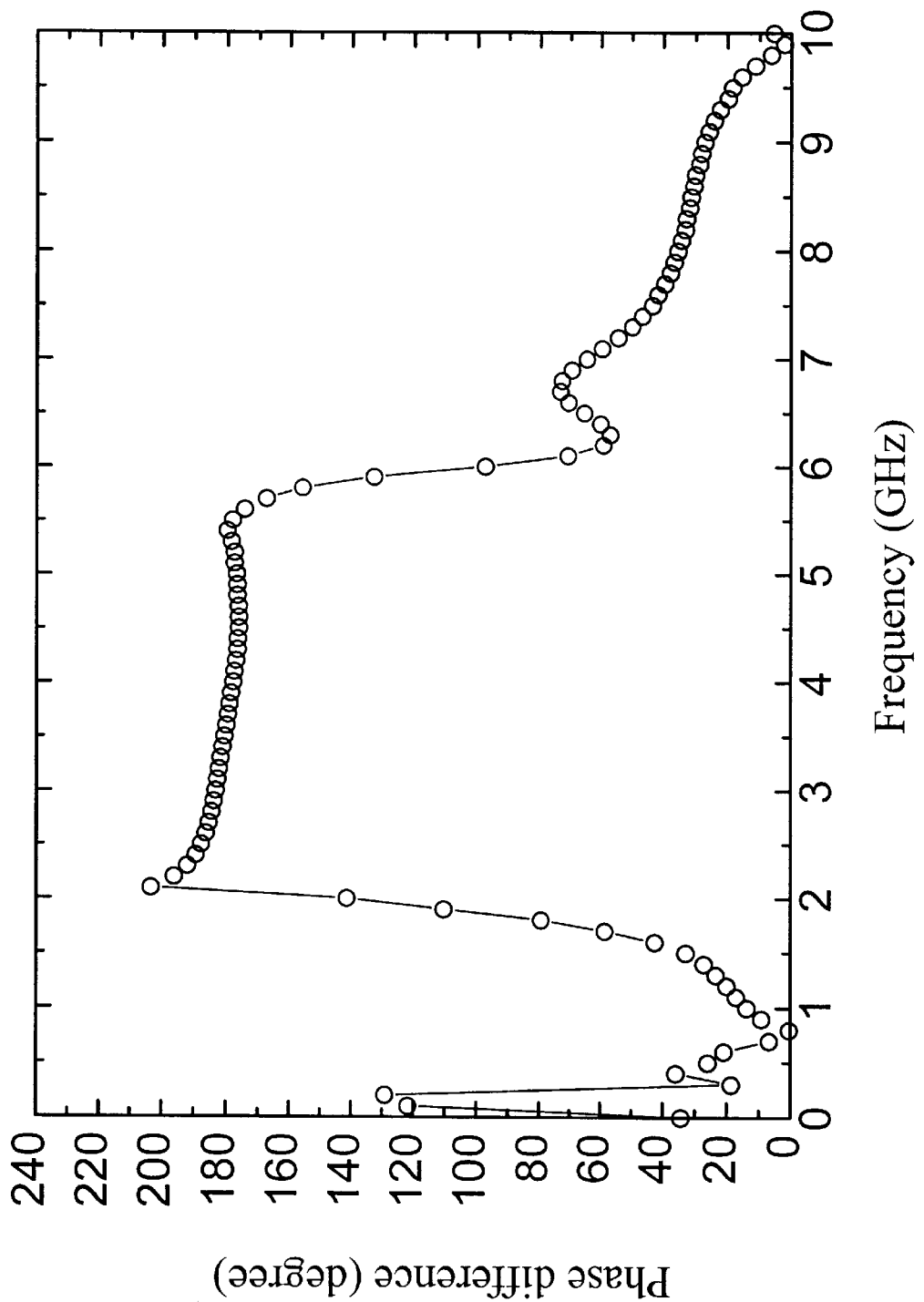

FIGS. 16(a)–16(b) shown Microwave circuit's measurement characteristics

Figure 17A:
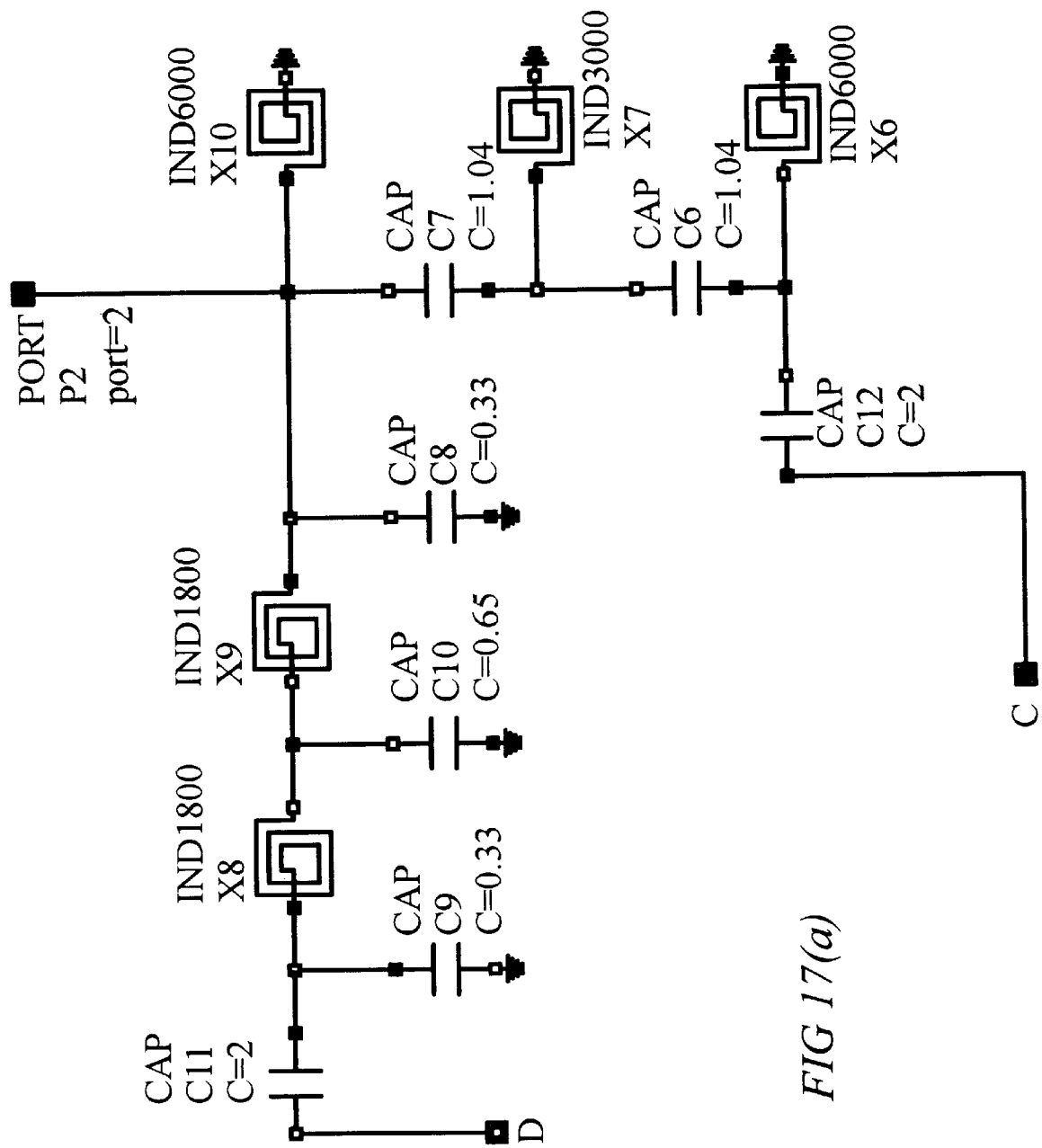
Figure 17B:
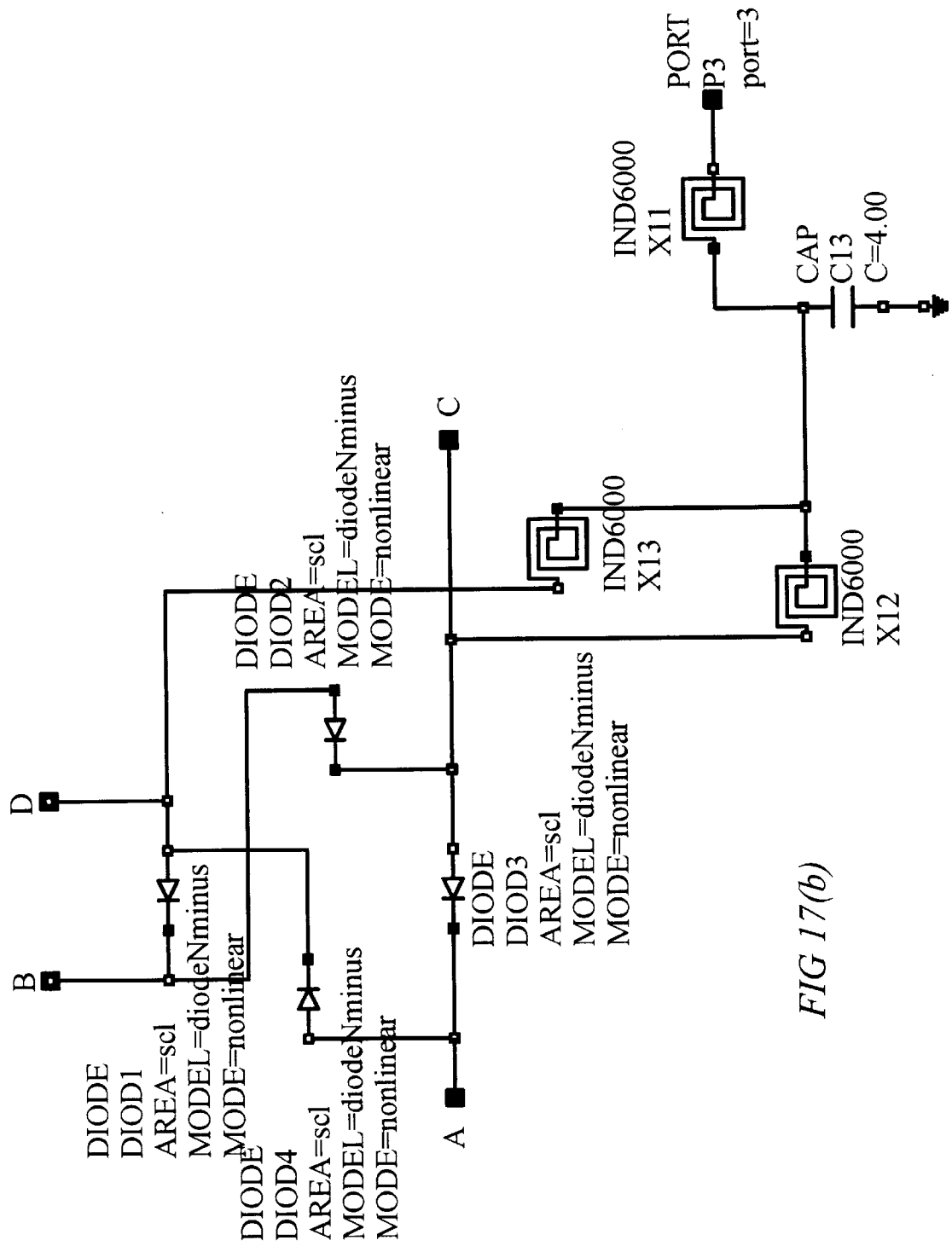
Figure 17C:
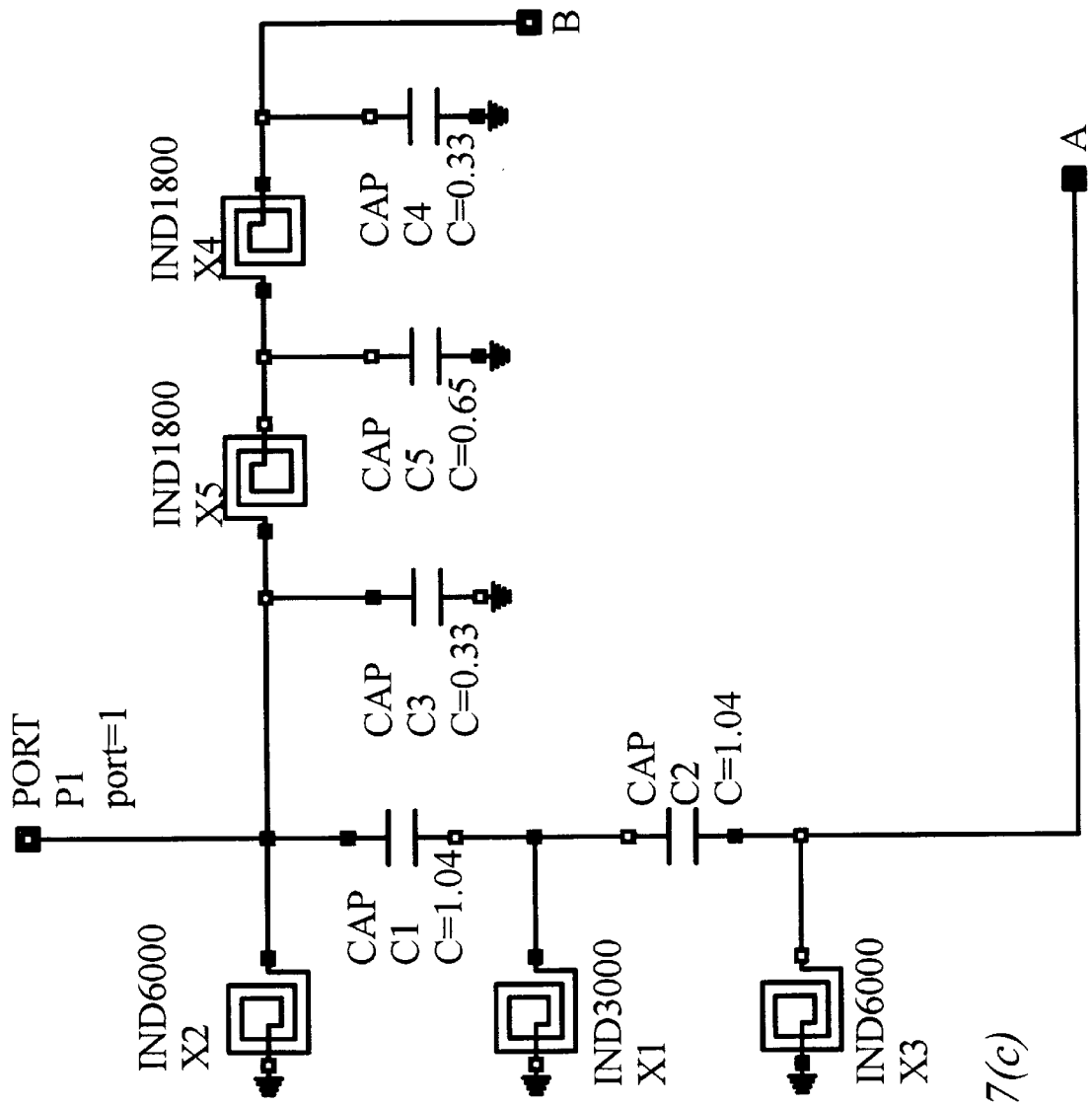
Figure 18A:
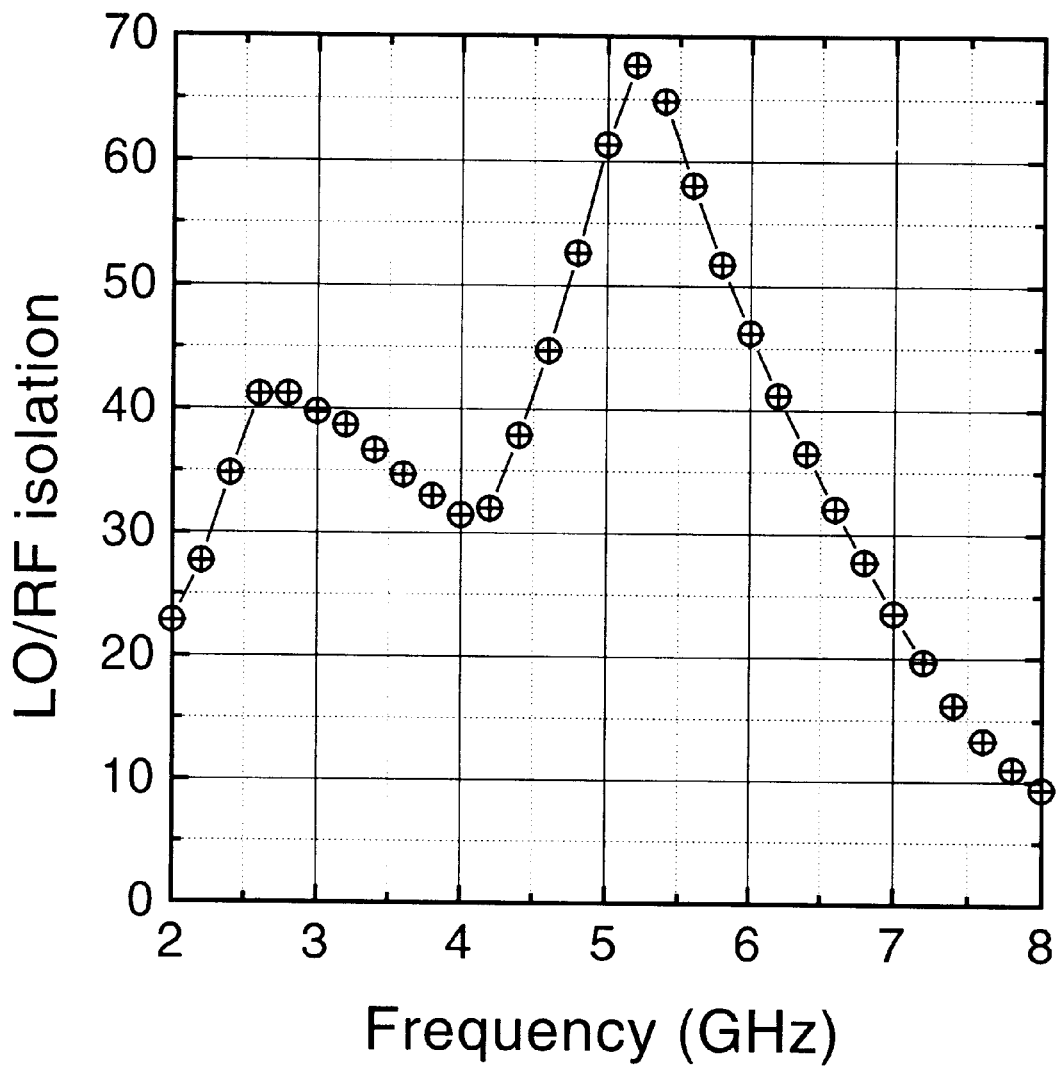
Figure 18B:
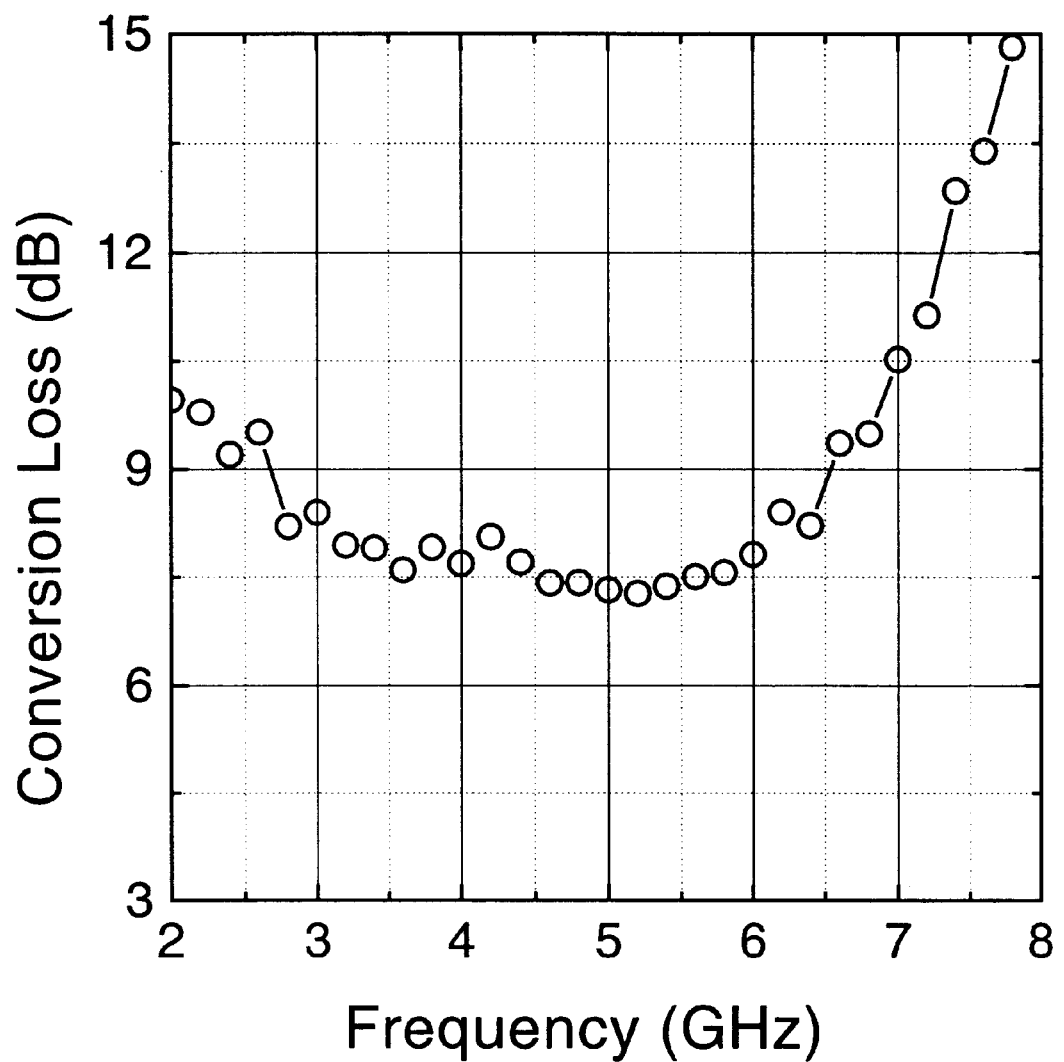
Figure 19:
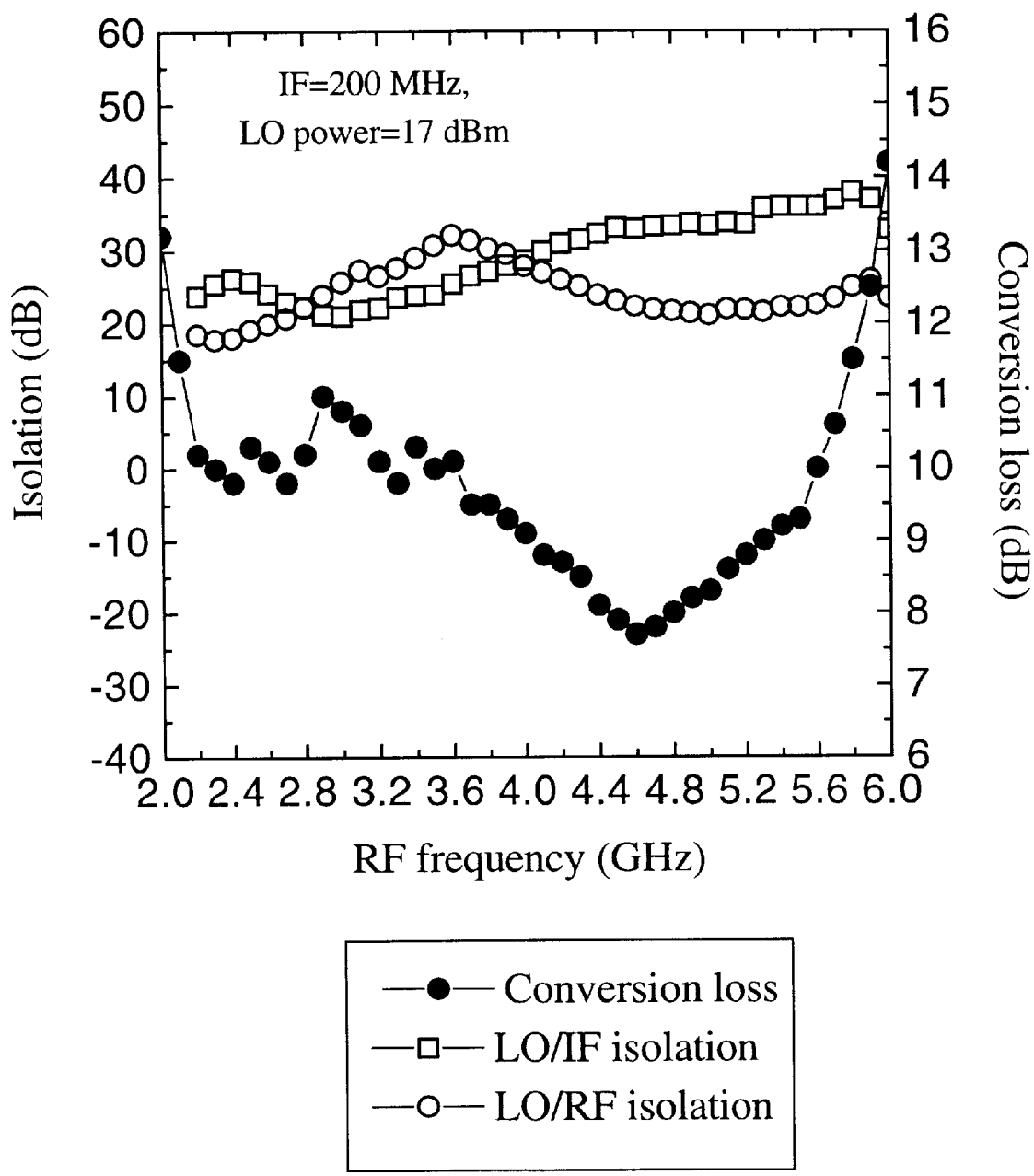
Figure 20:
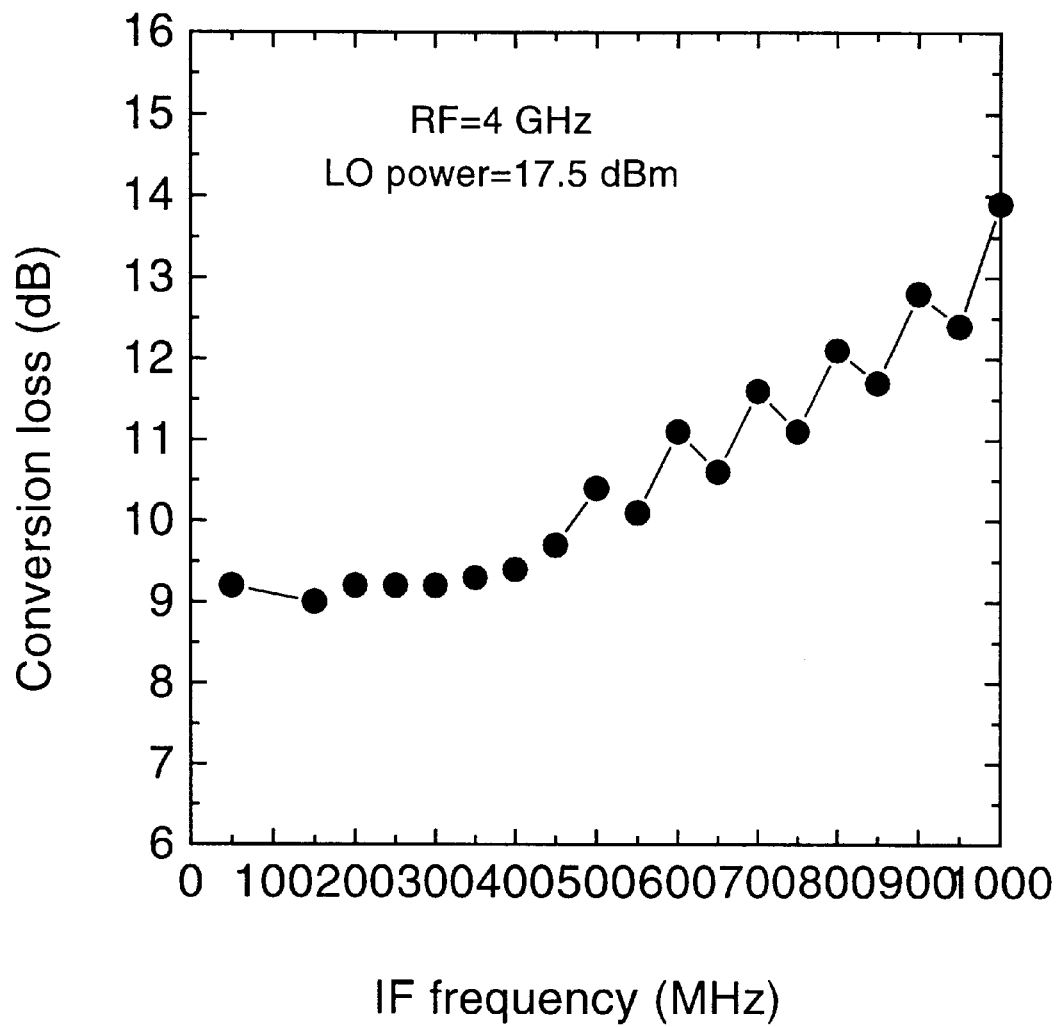
Figure 21A:
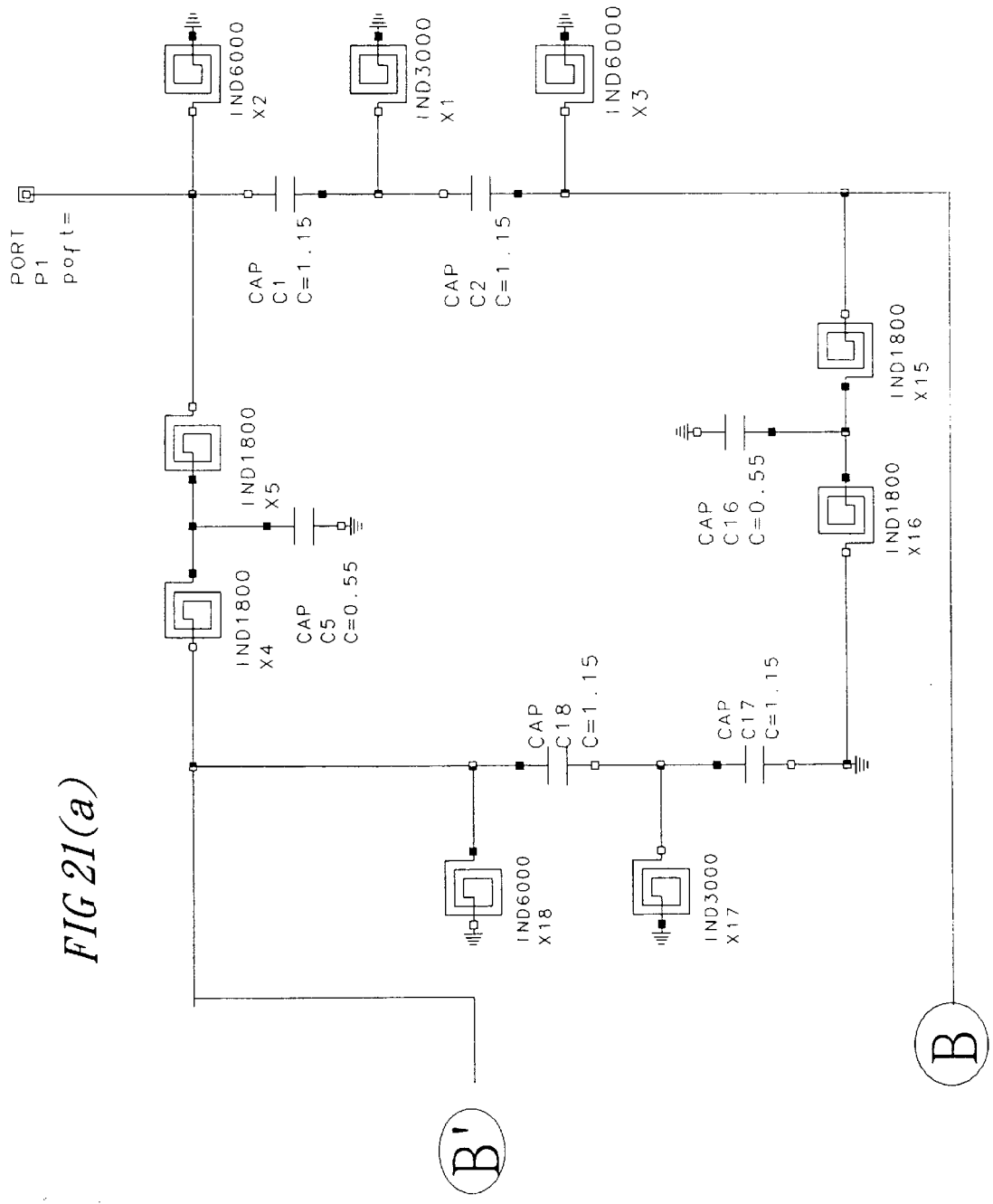
Figure 21C:
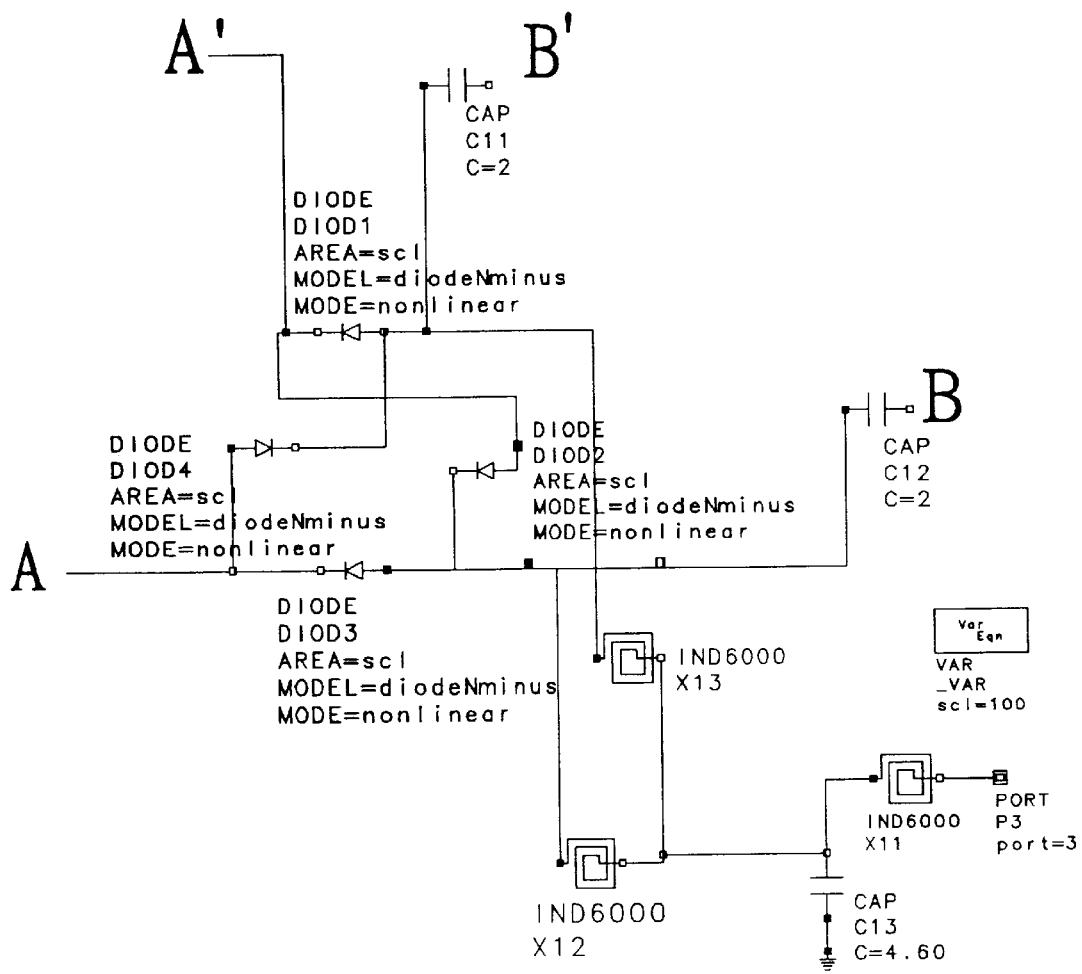
Figure 22A:
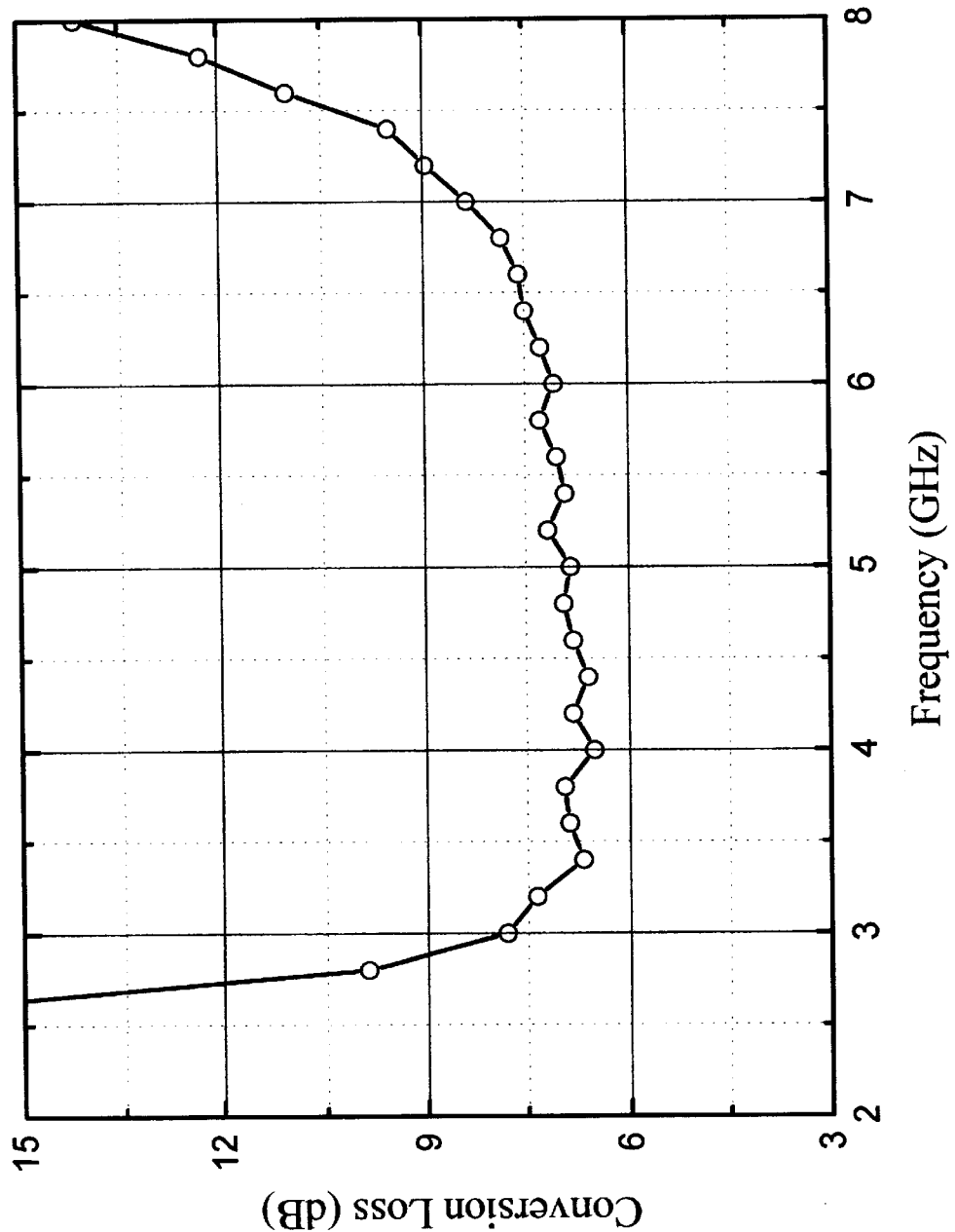
Figure 22B:
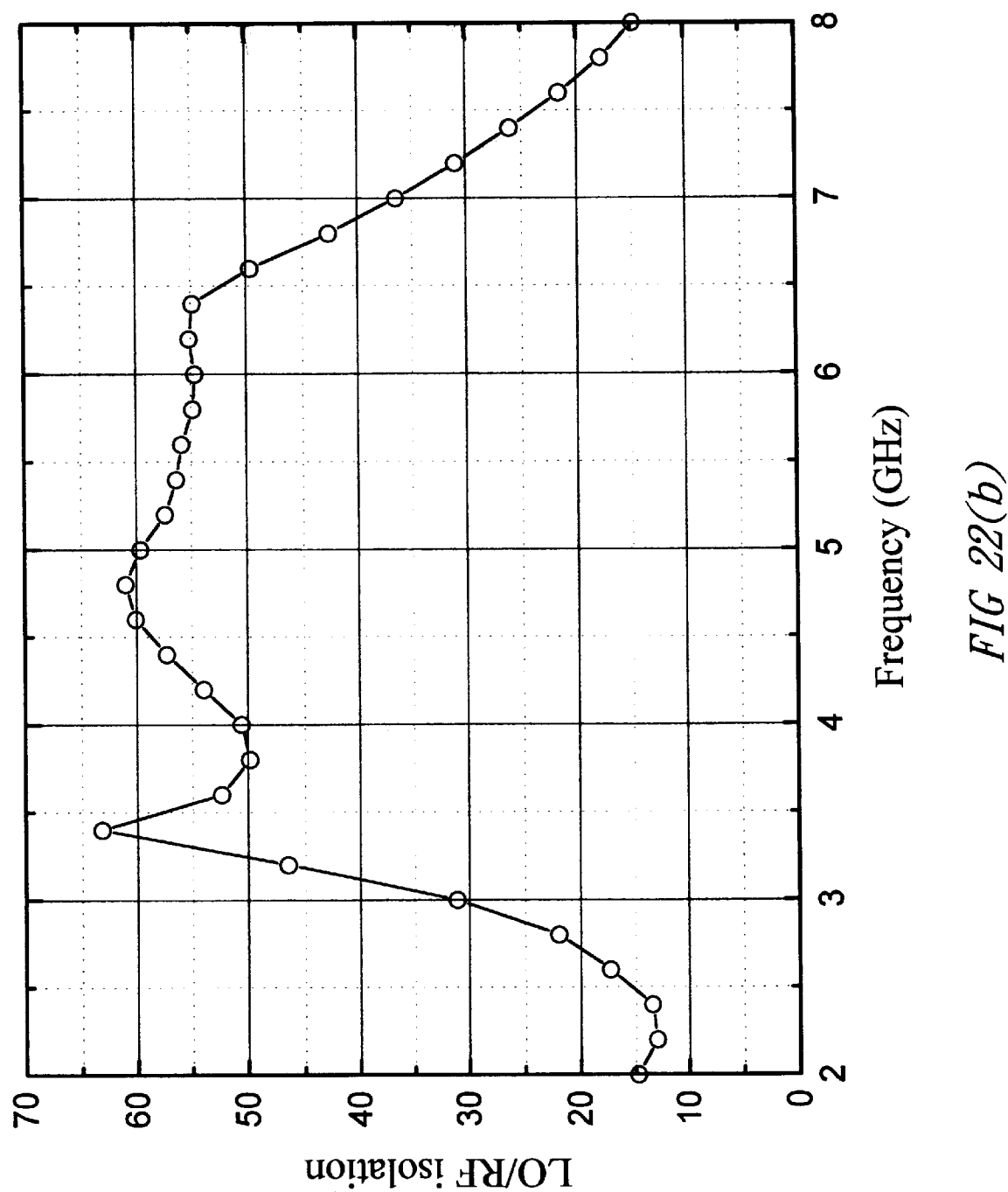
Figure 23:
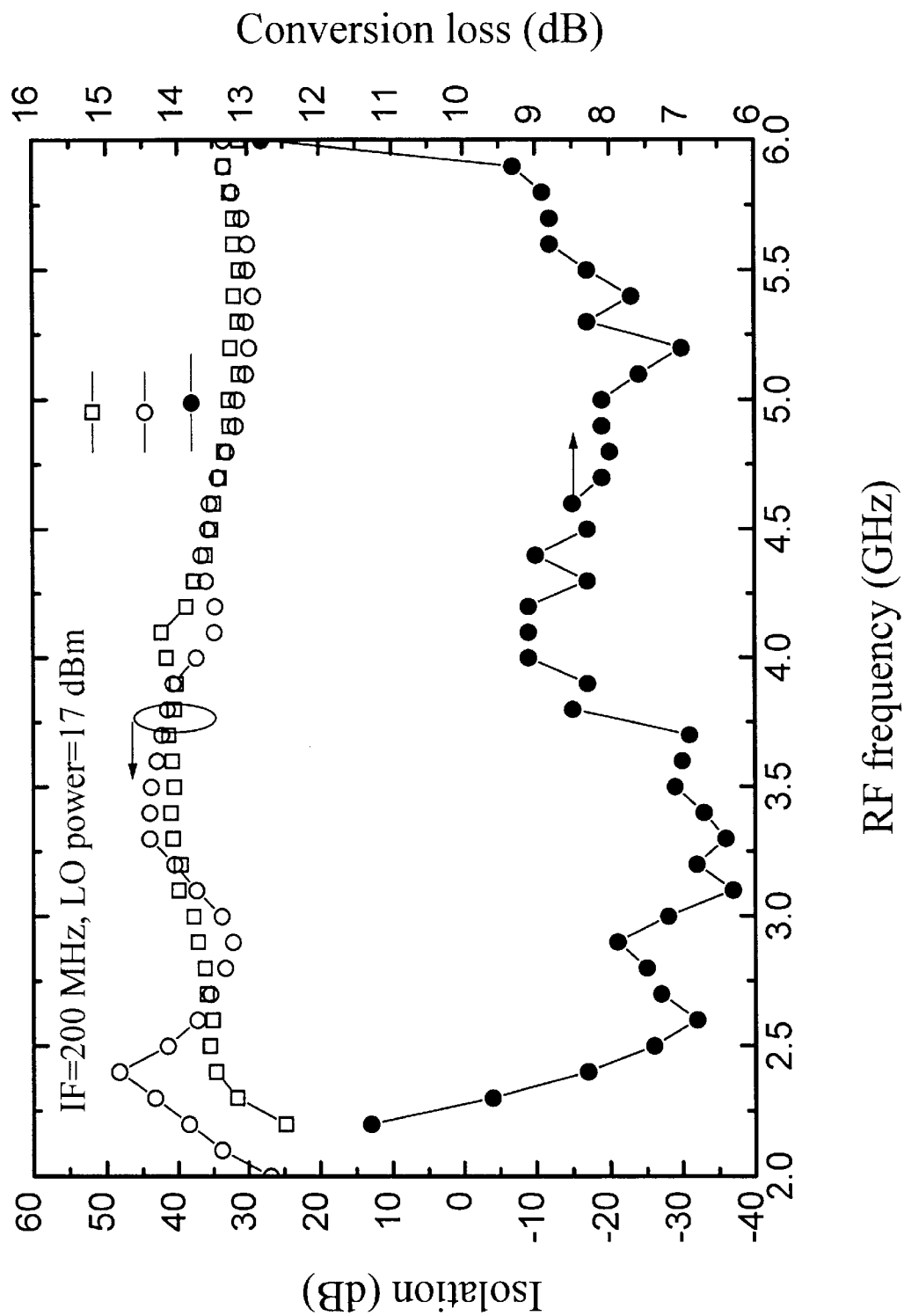

FIG. 16(a) Compensated high/low-pass balance-to-unbalance line transition insertion loss and return loss
■ . . . Low-pass filter(LPF-arm)
● . . . High-pass filter (HPF-arm)
○ . . . return loss FIG. 16(b) Compensated high/low-pass balance-to-unbalance line transition phase
● . . . | phase difference 180° | (degree)
○ . . . phase difference FIG. 17 is a diagram of double-balanced frequency mixer (DBM) design illustration FIGS. 18(a)–18(b) shows double-balanced frequency mixer (DBM) characteristics FIG. 18(a) Simulated conversion loss
FIG. 18(b) Local oscillation/RF frequency isolation FIG. 19 shows Dual-balanced monolithic microwave integrated circuit frequency mixer simulated conversion loss and isolation □ . . . Local oscillation/Input frequency isolation
○ . . . Local oscillation/RF frequency isolation
● . . . Conversion loss FIG. 20 shows double-balanced frequency mixer's intermediate frequency range
RF=4 GHZ
LO=17.5 dBm FIG. 21 is a diagram of Compensated double-balanced frequency mixer illustration FIGS. 22(a)–22(b) shown Compensated double-balanced frequency mixer characteristics FIG. 22(a) Simulated conversion loss
FIG. 22(b) Local oscillation/RF frequency isolation FIG. 23 shows Compensated dual-balanced monolithic microwave integrated circuit frequency mixer conversion loss and isolation □ . . . Local oscillation/Input frequency isolation
○ . . . Local oscillation/RF frequency isolation
● . . . Conversion loss FIG. 24 shows Compensated double-balanced frequency mixer intermediate bandwidth frequency
(RF)=3 GHz

DETAILED DESCRIPTION OF THE INVENTION

The proposed circuit uses a lumped constant compensated high/low-pass balance-to-unbalance line transition, which consists of an unbalanced type signal port, one balanced signal port, high-pass filter, low-pass filter, compensated high-pass filter, compensated low-pass filter. The high-pass low-pass filter circuit combination can be connected in parallel with several Pi type or T type inductors or capacitors to form a network.

Lumped constant compensated high/low-pass balance-to-unbalance line transition structure derives from its unbalanced signal port parallel-connected to the first set of high/low-pass filters the signal port of the first set of high-pass filter is then parallel-connected to the second set of compensated filter's low-pass filter to ground. The first set of low-pass filter's output port is then parallel-connected to the second set of compensated filter's high-pass filter to ground. These two output ports are the balanced signal port.

This lumped constant compensated high/low balance-to-unbalance line transition structure can be adapted to various connecting types, for example;

(1) Unbalanced signal port output terminal parallel-connected with the first set of Pi type high-pass filter, Pi type low-pass filter at the balanced signal port output terminal, and then parallel-connected the second set of compensated Pi type high-pass filter, Pi type low-pass filter to ground as shown in FIG. 9.

(2) Unbalanced signal port output terminal parallel-connected with the first set of T type high-pass filter, T type low-pass filter; balanced signal port output terminal parallel-connected with the second set of compensated T type high-pass filter, T type low-pass filter to ground as shown in FIG. 10.

(3) Unbalanced signal port output terminal parallel-connected with the first set T type high-pass filter, Pi type low-pass filter; balanced signal port output terminal parallel-connected with the second set of compensated Pi type low-pass filter, T type high-pass filter to ground as shown in FIG. 11.

(4) Unbalanced signal port output terminal parallel-connected with the first set of Pi type high-pass filter, T type low-pass filter; balanced signal port output terminal parallel connected with the second set of compensated T type low-pass filter, Pi type high-pass filter to ground as shown in FIG. 12.

All of the above lumped constant compensated high/low-pass balance-to-unbalance line transition structures can parallel-connect with n number of balanced-to-unbalanced converters to form a "one to 2n balanced-to-unbalanced converter."

Figure 1:
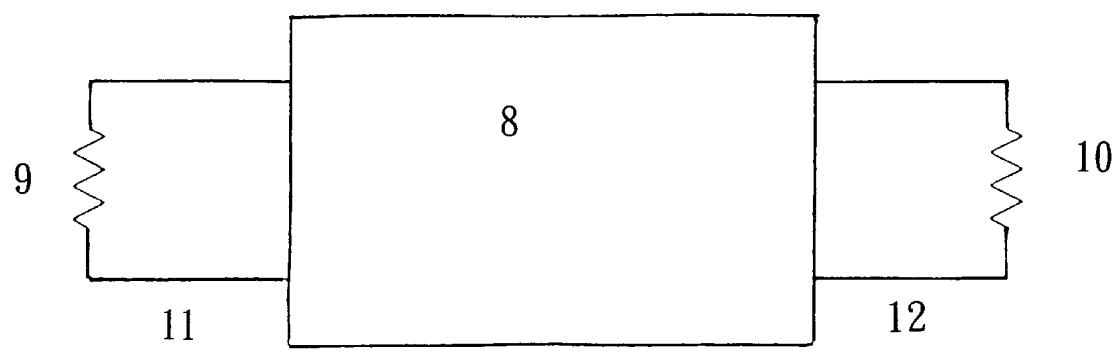
FIG. 1 is a diagram of Balanced-line to unbalanced-line transition illustration

As illustrated in FIG. 1, balance-to-unbalance line transition(Balun) equals a transformer at low frequency. It not only provides impedance transformation, but its balanced output also features equal amplitude with the output phase at reversed 180°. Its impedance transformation rate can be determined by balanced-to-unbalanced line transition system impedance value(Zt). Therefore, conventional synthesized balance-to-unbalance line transition(Balun) method, as illustrated in FIG. 2, uses high-pass/low-pass filter form to regulate a 3 db cutoff frequency (Fc) to reach balance-to-unbalance line transition(Balun). However, amplitude outside the cutoff frequency cannot be balanced. Concerning the design method in regard to narrow frequency bandwidth, the proposed circuit supplies a method, which is to add two sections, as shown in FIG. 3, of compensated high-pass/low-pass filters. Thus this can transform the conventional design into a compensated structure using low-pass filter's output port parallel-connected with high-pass filter to improve amplitude's imbalance form, while low-prototype filter can be synthesized into the circuit to get transfer function, such as typical Tchebyscheff, maximally flat transfer functions. But with this type of filter, frequencies outside the 3 db cutoff frequency have a tendency to decline rapidly, and its impedance is more difficult to define and with slightly inferior features.

Another synthesized method is made of a multiple serial connection with Pi type or T type inductor(L), capacitor(C) circuit, as shown in FIG. 4, prototype of low-pass filter, which is made of two inductors(L) and one capacitor (C) or two capacitors(C) and one inductor(L) as a basic section parallel-connected with three step filters. The inductor(L) value and capacitor(C) value can be calculated with various filter synthesizing methods to produce different amplitudes. With low-pass filter's duality, high-pass filter's inductor(L) value and capacitor(C) value, shown in FIG. 5, are obtained. Two simple basic synthesizing methods are: (1) Constant K method, and (2) Quasi-transmission line method. In comparison with these two methods, constant K method has to adjust high/low-pass filter's 3 db frequency cutoff rate variation individually, the inductor(L) value obtained is relatively higher, thus the actual size of the circuit is larger. Therefore, Quasi-transmission line method becomes the best filter prototype synthesizing method. As shown in FIG. 6, Quasi-transmission line method features the filter as a section that includes ZO feature impedance, and θ phase match. ABCD matrix is plotted to transform Quasi-transmission line to Pi type or T type equating circuit, and then compared directly with lumped element filter, using ZO, θ operating frequencies to obtain the inductor and capacitor values needed. In which if θ is designated as 90° in low-pass filter, then the θ in high-pass filter will be designated at 90°. If it is required to increase the step number then use θ=90°/N to parallel-connect N step basic section to obtain high-step filter structure. High-step filter design only needs to increase the number of elements to provide better frequency uniformity.

Transforming 50 ω unbalanced line to 100 ω balanced line, as shown in FIG. 7, is the simulated feature of first to third step 50 to 100 ω's balanced-to-unbalanced line transition. N value features a first to third step return loss, phase balance, and amplitude. When N=2 at balance-to-unbalance line transition, the bandwidth has a 1:2 ratio, which features 67% of bandwidth, return loss less than 15 db, and amplitude differential less than 0.4 db while phase differential is maintained at 180°. In order to achieve features such as precise return loss, amplitude and phase match, it derives from when N=3 at balanced-to-unbalanced line transition, with features of return loss less than 20 db, amplitude difference less than ±0.1 db, and phase differential maintained at 180°, except that the bandwidth will be slightly reduced to 50%. FIG. 8 indicates N=2 the results of measurement for balance-to-unbalance line transition at center frequency 1.6 GHz within 1 GHz frequency bandwidth. FIG. 8(a) indicates balanced output insertion loss as −3.5±0.6 db. FIG. 8(b) indicates frequency match less than ±0.6 db. Slightly higher frequency match than the theorized value is due to the influence from self-resonance frequency, whereas phase differential is less affected by attached elements. As illustrated in FIG. 8(c) the phase differential is nearly a perfect 180°. Lumped constant compensated high/low-pass balance-to-unbalance line transition structure can be parallel-connected with n number of balanced-to-unbalanced line transition to form a "one to 2n balanced-to-unbalanced line transition " as shown in FIG. 13. When n=2 it is a dual type balance-to-unbalance line transition. This type of circuit is widely used in the design of star double-balance mixer, double double-balance mixer.

EXAMPLE 1

Applying a microwave circuit's balanced-to-unbalanced line transition, a wide bandwidth microwave transformer circuit is obtained by connecting two sets of high-pass filters and two sets of low-pass filters to form a compensated network.

Figure 16C:
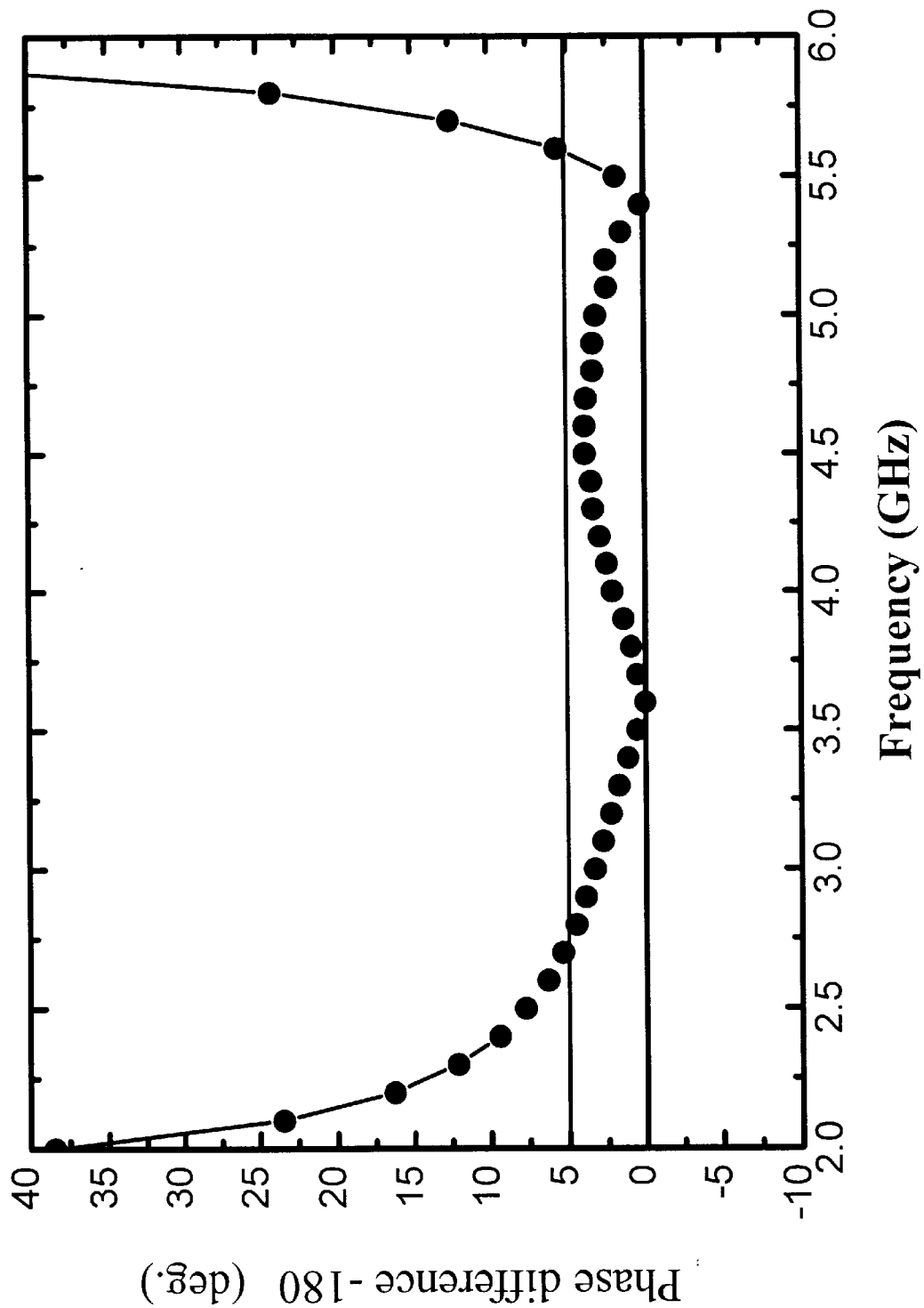

As illustrated in FIG. 14, high-pass and low-pass filters are parallel-connected to a three port network, with which to select the filter system's impedance to determine the impedance transformation rate from unbalanced port to balanced port and the equal signal amplitude from balanced port. Phase differential results in a differential signal. At this time the center frequency is at a perfect amplitude balance, and the farther away from the center frequency the greater the amplitude differential. This can be compensated by connecting the same set of compensated filters at the output terminal to compensate the phenomenon of unbalanced frequency, and at the same time not affecting reversed phase differential output. FIG. 15 indicates the simulated characteristics of the proposed circuit. FIG. 15(a) indicates amplitude output, FIG. 15(b) illustrates the simulated phase imbalance. Due to the fact that the inductor is not an ideal value on the monolithic microwave integrated circuit, and that under the influence of parasitics circuit, as shown in FIG. 16, it indicates the actual measurement characteristics to be within 2.25 to 5.7 GHz, and the output still maintained at −4.4±1 db's frequency match. The unbalanced line input terminal return loss is lower than −10 db ranging within 2.6 and 5.7 GHz; the phase error is approximately ±5°.

EXAMPLE 2

Double-balance Mixer

The proposed circuit uses two sets of high-pass and low-pass filters to form a balanced-to-unbalanced line transition. The circuit size can be reduced by using less lumped elements. This balance-to-unbalance line transition supplies to the output of double-balance mixer's local oscillation and RF signal frequency to combine with two mixer diodes to form cross over quad, or ring quad diodes. Because the local oscillation pushes the diode to its built-in voltage area, large time varying nonlinear conductance g(t) can be obtained. The g(t) and RF signals are mixed for combinations of their different frequency harmonics, which is then converted by the effect of balance-to-unbalance line transition to the required intermediate frequency signal and retrieved from a diplexing low-pass filter. Other spurious signals have to reply on balanced-to-unbalanced line transition, or a diplexer design for mutual compensation, or be rejected by a double diplexer filter. With regard to double-balanced mixer, Lo even-harmonics signals will be canceled by the balanced-to-unbalanced line transition. Thus the key design in double-balanced mixer is to obtain a constant frequency, phase differential wide bandwidth balance-to-unbalance line transition.

FIG. 17 is a schematic for the double-balanced mixer; FIG. 18 is the simulated conversion loss of a linear oscillation/RF frequency isolation. 10 db conversion loss bandwidth can be isolated from 2–7 GHz to approximately greater than 20 db, as shown with actual experiment to measure the results in FIG. 19. Conversion loss between 8–10 db can be isolated from 2.1–5.7 GHz, which is approximately 60% of the bandwidth. Due to the layout restriction, it is less efficient at low frequency conversion loss, which in turn leads to less efficiency in the features of balanced-to-unbalanced line transition. FIG. 20 is the actual circuit with its RF frequency below 4 GHz in intermediate frequency as divided at 10 db conversion loss, which is approximately the intermediate-RF bandwidth of 500 MHz. Due to the fact that the implemented circuit is a relatively comparative unit, hybrid ratrace has a wider frequency resonance, but it is less ideal compared with the proposed circuit concept as implemented in example 1 or example 3.

EXAMPLE 3

Compensated Double-balanced Mixer

The proposed circuit supplies a circuit with synthesized lumped elements and a double-balanced mixer circuit on balance-to-unbalance line transition circuit to replace conventional, complicated, non two-dimensional balanced-to-unbalanced line transition design; refer to example 2 for the design theory concerning the mixer. Using balance-to-unbalance line transition, the improvement can be seen in the isolation feature. The measurement results of the proposed circuit confirm that balance-to-unbalance line transition application in double-balanced mixer's design as described in example 1, has apparent electrical improvement.

FIG. 21 is a schematic for a compensated double-balanced mixer, in the schematic the transformer is replaced by a compensated balance-to-unbalance line transition in example 1. And FIG. 22 is the characteristics of a completely compensated double-balanced mixer. From the measurement and simulation of this mixer's conversion loss and isolations, there is an approximately ±–1 db variation between the experimentation and simulation. The actual measurement of experimentation is as shown in FIG. 23. With a frequency bandwidth conversion loss at 10 db it can reach between 1.5 to 5.3 GHz; the range is the equivalent of 111% bandwidth which far exceeds the comparison of 60% bandwidth in example 2 by an improvement of 1 to 3 db. And with the isolation of linear oscillation/RF frequency, the improvement is found to be at 10 to 20 db, which is sufficient to indicate that the features of such compensated balance-to-unbalance line transition are far better than the conventional structure. FIG. 24 is the actual schematic with intermediate-FR bandwidth reaching 900 MHz.

Summarizing the above, the proposed circuit can be applied to production applications to supply a simple and executable planar circuit layout, to be utilized mainly in frequency transmission elements, such as in the design of monolithic microwave integrated circuit for mixer, modulator, demodulator adjustor, and phase detector circuit. The major contribution of the proposed circuit is to substitute most of the non-planar, bulky conventional balanced-to-unbalanced line transition structures, and to replace them with lumped elements, so that the microwave integrated circuit can be designed in a flat surface, which is a prerequisite in the production of integrated circuits. It produces circuits in small sizes (which means a cost reduction), and simplifies integrated circuit design aided from computer assisted design by replacing conventional distributed transmission line with lumped elements. It also greatly reduces the time and cost associated with the early designing stage, thus the proposed circuit design is very suitable for use in the practical implementation of manufacturing production.

What is claims is:

1. A lumped constant compensated high/low-pass balance-to-unbalance line transition structure, comprising an unbalanced single terminal-type signal port, a balanced signal port, a high-pass filter circuit and a low-pass filter circuit each connected in parallel to said unbalanced signal port and said balanced signal port, and a compensated high-pass filter circuit and a compensated low-pass filter circuit each connected in parallel to said balanced signal port and ground so as to maintain phase differential balance and amplitude balance.

2. The lumped constant compensated high/low-pass balance-to-unbalance line transition structure as claimed in claim 1, wherein the circuits of said high-pass filter, low-pass filter, compensated high-pass filter, and compensated low-pass filter are comprised of a plurality of steps of Pi type and T type filters consisting of inductors and capacitors to form a network.

3. The lumped constant compensated high/low-pass balance-to-unbalance line transition structure as claimed in claim 1, wherein:

a) said high-pass filter circuit having an output terminal;
   b) said compensated low-pass filter circuit being connected to said high-pass filter circuit output terminal and ground in parallel with said high-pass filter circuit;
   c) said low-pass filter circuit having an output terminal; and
   d) said compensated high-pass filter circuit being connected to said low-pass filter circuit output terminal and ground in parallel with said low-pass filter circuit, whereby said high-pass filter circuit output terminal and said low-pass filter circuit output terminal form said balanced signal port.

4. A one to 2n balance-to-unbalance line transition structure comprising n lumped constant compensated high/low-pass balance-to-unbalance line transition structures connected in parallel, each said parallel structure as defined in claim 1, wherein n is a whole number.

5. A lumped constant compensated high/low-pass balance-to-unbalance line transition structure, comprising an unbalanced signal port output terminal, a Pi type high-pass filter circuit and a Pi type low-pass filter circuit each connected in parallel to said unbalanced signal port output terminal and a respective balanced port output-terminal, and a compensated Pi type high-pass filter circuit and a compensated Pi type low-pass filter circuit each connected in parallel to said respective balanced port output-terminals and ground so as to maintain phase differential balance and amplitude balance.

6. A one to 2n balance-to-unbalance line transition structure comprising n lumped constant compensated high/low-pass balance-to-unbalance line transition structures connected in parallel, each said parallel structure as defined in claim 5, wherein n is a whole number.

7. A lumped constant compensated high/low-pass balance-to-unbalance line transition structure, comprising an unbalanced signal port output-terminal, a T type high-pass filter circuit and a T type low-pass filter circuit each connected in parallel to said unbalanced signal port output-terminal and a respective balanced port output-terminal, and a compensated T type high-pass filter circuit and a compensated T type low-pass filter circuit each connected in parallel to said respective balanced port output-terminals and ground so as to maintain phase differential balance and amplitude balance.

8. A one to 2n balance-to-unbalance line transition structure comprising n lumped constant compensated high/low-pass balance-to-unbalance line transition structures connected in parallel, each said parallel structure as defined in claim 7, wherein n is a whole number.

9. A lumped constant compensated high/low-pass balance-to-unbalance line transition structure, comprising an unbalanced signal port output-terminal, a T type high-pass filter circuit and a Pi type low-pass filter circuit each connected in parallel to said unbalanced signal port output-terminal and a respective balanced port output-terminal, and a compensated Pi type low-pass filter circuit and a compensated T type high-pass filter circuit each connected in parallel to said respective balanced port output-terminals and ground so as to maintain phase differential balance and amplitude balance.

10. A one to 2n balance-to-unbalance line transition structure comprising n lumped constant compensated high/low-pass balance-to-unbalance line transition structures connected in parallel, each said parallel structure as defined in claim 9, wherein n is a whole number.

11. A lumped constant compensated high/low-pass balance-to-unbalance line transition structure, comprising an unbalanced signal port output-terminal, a Pi type high-pass filter circuit and a T type low-pass filter circuit each connected in parallel to said unbalanced signal port output-terminal and a respective balanced port output-terminal, and a compensated T type low-pass filter circuit and compensated Pi type high-pass filter circuit each connected in parallel to said respective balanced port output-terminals and ground so as to maintain phase differential balance and amplitude balance.

12. A one to 2n balance-to-unbalance line transition structure comprising n lumped constant compensated high/low-pass balance-to-unbalance line transition structures connected in parallel, each said parallel structure as defined in claim 11, wherein n is a whole number.

* * * * *